US009208874B2

(12) United States Patent
Lee et al.

(10) Patent No.: US 9,208,874 B2
(45) Date of Patent: Dec. 8, 2015

(54) NONVOLATILE MEMORY DEVICE HAVING VARIABLE RESISTIVE ELEMENTS AND METHOD OF DRIVING THE SAME

(71) Applicants: Yong-Kyu Lee, Hwaseong-Si (KR); Bo-Geun Kim, Suwon-Si (KR)

(72) Inventors: Yong-Kyu Lee, Hwaseong-Si (KR); Bo-Geun Kim, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 114 days.

(21) Appl. No.: 14/083,470

(22) Filed: Nov. 19, 2013

(65) Prior Publication Data

US 2014/0169068 A1    Jun. 19, 2014

(30) Foreign Application Priority Data

Dec. 18, 2012 (KR) .................... 10-2012-0148367

(51) Int. Cl.
*G11C 11/00* (2006.01)
*G11C 13/00* (2006.01)
*G11C 11/56* (2006.01)

(52) U.S. Cl.
CPC ........ *G11C 13/0064* (2013.01); *G11C 11/5678* (2013.01); *G11C 13/0069* (2013.01); *G11C 13/0004* (2013.01); *G11C 2013/0076* (2013.01); *G11C 2013/0078* (2013.01); *G11C 2013/0085* (2013.01); *G11C 2211/5622* (2013.01); *G11C 2213/72* (2013.01)

(58) Field of Classification Search
CPC .......... G11C 13/0064; G11C 13/0004; G11C 11/5678; G11C 13/0069; G11C 29/44
USPC .................. 365/148, 185.22, 189.07, 189.16
See application file for complete search history.

(56) References Cited

U.S. PATENT DOCUMENTS

| 7,304,885 | B2 | 12/2007 | Cho et al. |
| 7,522,449 | B2 | 4/2009 | Ro et al. |
| 7,535,747 | B2 | 5/2009 | Lee et al. |
| 8,102,716 | B2 | 1/2012 | Shiimoto et al. |
| 8,503,233 | B2 * | 8/2013 | Huang et al. ............. 365/185.03 |
| 2010/0097842 | A1 | 4/2010 | Hwang |
| 2010/0097849 | A1 | 4/2010 | Hwang et al. |
| 2010/0106893 | A1 | 4/2010 | Fasoli et al. |
| 2010/0238706 | A1 | 9/2010 | Tokiwa et al. |
| 2011/0157966 | A1 | 6/2011 | Lee |
| 2011/0283050 | A1 | 11/2011 | Pasquale et al. |
| 2012/0008405 | A1 * | 1/2012 | Shah et al. ................ 365/185.19 |
| 2013/0031429 | A1 * | 1/2013 | Sharon et al. ................ 714/718 |
| 2015/0085575 | A1 * | 3/2015 | Tam ........................ 365/185.11 |

* cited by examiner

*Primary Examiner* — Viet Q Nguyen
(74) *Attorney, Agent, or Firm* — Volentine & Whitt, PLLC

(57) ABSTRACT

A method is provided for driving a nonvolatile memory device. The method includes selecting first write drivers based on a predetermined current, performing a first program operation on resistive memory cells corresponding to the first write drivers, verifying whether the resistive memory cells have passed or failed in the first program operation and sorting information regarding failed bit memory cells that failed in the first program operation, selecting second write drivers based on the sorted failed bit memory cell information, and performing a second program operation on resistive memory cells corresponding to the second write drivers.

19 Claims, 32 Drawing Sheets

FIG. 3

| | 1_1 | 1_2 | 1_3 | 1_4 | 1_5 | 1_6 | 1_7 | 1_8 |
|---|---|---|---|---|---|---|---|---|
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | SA/WD(2_1) | | SA/WD(2_2) | | SA/WD(2_3) | | SA/WD(2_4) | |
| | PERIPHERY(3) | | | | | | | |
| | SA/WD(2_8) | | SA/WD(2_7) | | SA/WD(2_6) | | SA/WD(2_5) | |
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | 1_16 | 1_15 | 1_14 | 1_13 | 1_12 | 1_11 | 1_10 | 1_9 | ure of a ferromagnetic material (in the case of MRAMs).
NONVOLATILE MEMORY DEVICE HAVING VARIABLE RESISTIVE ELEMENTS AND METHOD OF DRIVING THE SAME

CROSS-REFERENCE TO RELATED APPLICATION

A claim for priority under 35 U.S.C. §119 is made to Korean Patent Application No. 10-2012-0148367, filed on Dec. 18, 2012, in the Korean Intellectual Property Office, the entire contents of which are hereby incorporated by reference.

BACKGROUND

Embodiments of the inventive concept relate to a driving method of a nonvolatile memory device using a variable resistive element, and a nonvolatile memory device.

Nonvolatile memories using resistance materials include phase-change random access memories (PRAMs), resistive RAMs (RRAMs), and magnetic RAMs (MRAMs), for example. While dynamic RAMs (DRAMs) or flash memories store data using charges, nonvolatile memories using resistance materials store data using a state change of a phase-change material, such as chalcogenide alloy (in the case of PRAMs), a resistance change of a variable resistance material (in the case of RRAMs), or a resistance change of a magnetic tunnel junction (MTJ) thin film according to a magnetization state of a ferromagnetic material (in the case of MRAMs).

In particular, a phase-change material of a PRAM enters a crystalline state from an amorphous state as it is cooled after being heated. The phase-change material has low resistance in the crystalline state and has high resistance in the amorphous state. Therefore, the crystalline state may be defined as set data or data 0, and the amorphous state may be defined as reset data or data 1.

SUMMARY

Embodiments of the inventive concept provide driving methods of a nonvolatile memory device, which have improved program speed and reduced power consumption. Embodiments of the inventive concept also provide nonvolatile memory devices, which have improved program speed and reduced power consumption.

These and other objects of the inventive concept will be described in or be apparent from the following description of embodiments.

According to an aspect of the inventive concept, there is provided a method of driving a nonvolatile memory device. The method includes selecting first write drivers based on a predetermined current, performing a first program operation on resistive memory cells corresponding to the first write drivers, verifying whether the resistive memory cells have passed or failed in the first program operation and sorting information regarding failed bit memory cells that failed in the first program operation, selecting second write drivers based on the sorted failed bit memory cell information, and performing a second program operation on resistive memory cells corresponding to the second write drivers.

According to another aspect of the inventive concept, there is provided a method of driving a nonvolatile memory device. The method includes selecting resistive memory cells corresponding to a first logic state among multi level states, selecting first write drivers operable with a predetermined current among the selected resistive memory cells, allowing the selected first write drivers to perform a program operation on the resistive memory cells with the first logic state, verifying the programmed resistive memory cells and sorting addresses of failed bit resistive memory cells, and selecting second write drivers operable with the predetermined current among the failed bit resistive memory cells and reprogramming the selected second write drivers with the first logic state.

According to still another aspect of the inventive concept, there is provided a method of driving a nonvolatile memory device using program loops including consecutive first and second program operation loops. The method includes allowing a plurality of selected first write drivers to program a plurality of resistive memory cells in the first program loop, and allowing a plurality of selected second write drivers to program a plurality of resistive memory cells in the second program loop. The selected first write drivers and the selected second write drivers overlap.

According to a further aspect of the inventive concept, there is provided a nonvolatile memory device including multiple write drivers, multiple sense amplifiers, and a register. The write drivers are configured to provide a program current to a multiple resistive memory cells. The sense amplifiers are configured to verify whether the resistive memory cells have passed or failed program operations. The register is configured to store addresses of the resistive memory cells verified as failed resistive memory cells. Write drivers corresponding to the addresses stored in the register among the multiple write drivers operate, and the number of the operating write drivers is determined based on a predetermined maximum operation current.

According to a further aspect of the inventive concept, there is provided a nonvolatile memory device including a memory cell array comprising multiple resistive memory cells; a write & verify driver comprising multiple write drivers and corresponding multiple verify drivers, each write driver being configured to write data in a corresponding set of memory cells of the memory cell array; a write buffer configured to temporarily store data to be written to the memory cell array through the write & verify driver, the write buffer comprising a failed bit information register; and control logic configured to select at least one first write driver from among the write drivers in the write & verify driver to perform a first program operation on the set of memory cells corresponding to each of the selected at least one first write driver. At least one verify driver corresponding to the selected at least one first write driver verifies whether the memory cells have passed or failed the first program operation and stores information about failed bit memory cells in the failed bit information register. The control logic is further configured to select at least one second write driver from among the write drivers corresponding to the failed bit memory cells identified in the failed bit information register to perform a second program operation on the set of memory cells corresponding to each of the selected at least one second write driver.

BRIEF DESCRIPTION OF THE DRAWINGS

The above and other objects and features will become apparent from the following description with reference to the attached figures, in which:

FIG. 3 is a block diagram of a resistive memory device according to embodiments of the inventive concept;

DETAILED DESCRIPTION

Figure 1:
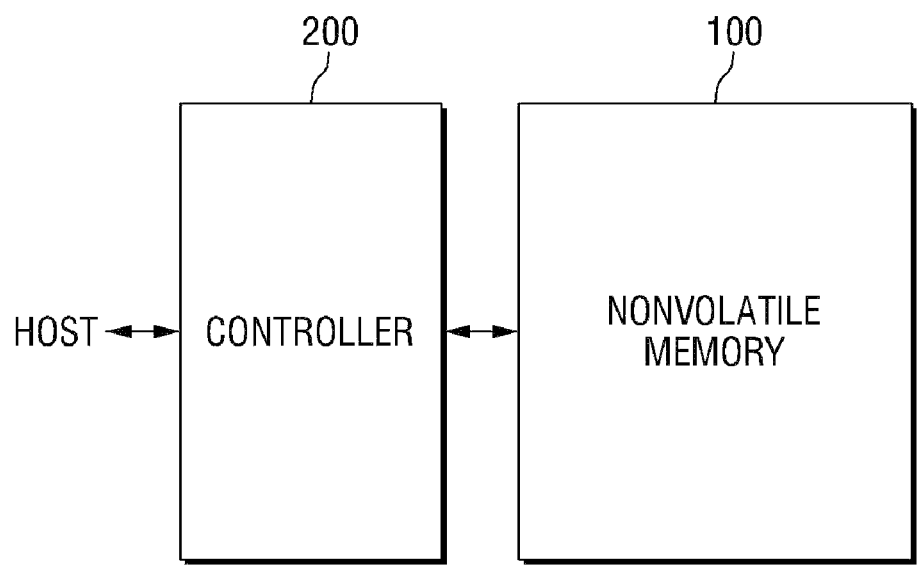
FIG. 1 is a block diagram of a memory system including a resistive memory device, according to an embodiment of the inventive concept.

Embodiments will be described in particular with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

The use of the terms "a" and "an" and "the" and similar referents in the context of describing the embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "exemplary" indicates an illustration or an example.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The term "unit" or "module", as used herein, means, but is not limited to, a software and/or hardware component, such as a field programmable gate array (FPGA) or an application specific integrated circuit (ASIC), which performs certain tasks. A unit or module may advantageously be configured to reside in the addressable storage medium and configured to execute on one or more processors. Thus, a unit or module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units or modules may be combined into fewer components and units or modules or further separated into additional components and units or modules.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, exemplary embodiments of the inventive concept will be described using a phase-change random access memory (PRAM). However, as would be apparent to those of ordinary skill in the art to which the inventive concept pertains, the inventive concept may be applied to all types of nonvolatile memories using resistance materials, such as resistive RAMs and magnetic RAMs.

FIG. 1 is a block diagram of a memory system including a nonvolatile memory, according to an embodiment of the inventive concept.

Referring to FIG. 1, memory system 1000 includes a resistive memory device 100 and a controller 200. The resistive memory device 100 includes a memory cell array and logic circuits controlling data input to and output from memory cells of the memory cell array. The resistive memory device 100 according to an embodiment of the inventive concept will be described in particular with reference to FIGS. 2 to 11. The controller 200 controls the resistive memory device 100 to read and/or write data stored in the resistive memory device 100 in response to a read/write request from a host. A protocol for performing exchange of data between the host and the controller 1200 is enabled by a host interface.

The controller 200 may include RAM, a processing unit, host interface, and a memory interface. The RAM may be used as the operating memory of the processing unit. The processing unit may be configured to control the overall operation of the controller 200. The host interface may enable a protocol for performing the exchange of data between a host and the controller 200. In exemplary embodiments, the controller 200 may be configured to communicate with an external host using one or more data protocols, such as universal serial bus (USB), multimedia card (MMC), peripheral component interconnect express (PCI-E), advanced technology attachment (ATA), serial-ATA (SATA), parallel-ATA (PATA), small computer system interface (SCSI), enhanced small device interface (ESDI), and integrated drive electronics (IDE), although other protocols may be incorporated without departing from the scope of the present teachings.

The controller 200 and the resistive memory device 100 may be integrated within a single integrated circuit device. In an embodiment, the controller 200 and the resistive memory device 100 are integrated within a memory card. For instance, the controller 200 and the resistive memory device 100 may be integrated into a PC card (PCMCIA), a compact flash card (CF), a smart media card (SM/SMC), a memory stick, a multimedia card (MMC, RS-MMC, MMCmicro), an SD card (SD, miniSD, microSD), or a universal flash memory device (UFS). In another embodiment, the controller 200 and the resistive memory device 100 may be integrated to form a solid-state disk/drive (SSD).

Figure 2:
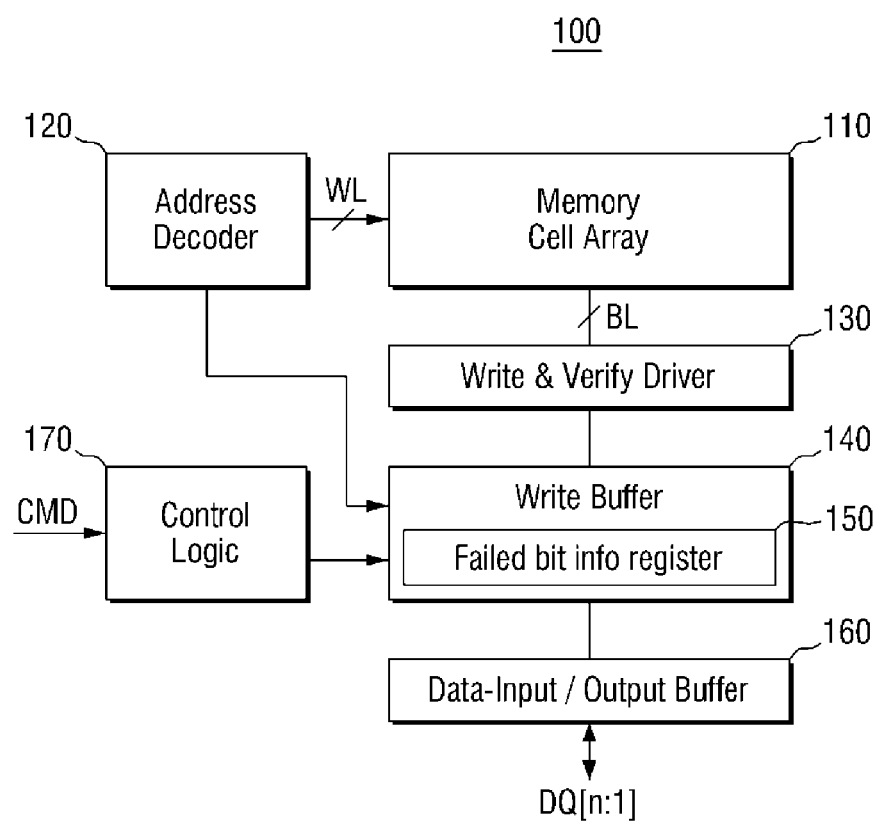
FIG. 2 is a block diagram of the resistive memory device shown in FIG. 1, according to an embodiment of the inventive concept.

FIG. 2 is a block diagram of the resistive RAM shown in FIG. 1, according to an embodiment of the inventive concept.

Referring to FIG. 2, the resistive memory device 100 includes a memory cell array 110, an address decoder 120, a write & verify driver 130, a write buffer 140, a data input/output buffer 160 and control logic 170.

The memory cell array 110 may include a plurality of word lines WL and a plurality of bit lines BL. Memory cells may be connected at intersections of the word lines WL and the bit lines BL. A configuration of the memory cell array 110 will be described in particular with reference to FIGS. 3 to 4.

The address decoder 120 is connected to the memory cell array 110 through the word lines WL. The address decoder 120 decodes an externally input address ADDR to select the word lines WL and the bit lines BL. The externally input address ADDR includes row addresses for selecting the word lines WL and column addresses for selecting the bit lines BL.

The write & verify driver 130 programs data to the memory cell array 110. The write & verify driver 130 includes one or more write drivers for programming corresponding groups of memory cells in the memory cell array 110 and one or more verify drivers (e.g., sense amplifiers) for verifying the programming (pass/fail) of the corresponding groups of memory cells. More particularly, the write & verify driver 130 receives program pulses, verifies pulses and data, and supplies a program current and a verify current to the memory cell array 110. Here, the program pulses include a set pulse and a reset pulse. The program current includes a set current and a reset current. For example, when data "0" is input, the write & verify driver 130 supplies the set current in response to the set pulse, and when data "1" is input, the write & verify driver 130 supplies the reset current in response to the reset current.

The write buffer 140 temporarily stores data to be written through the write & verify driver 130 to the memory cell array 110, and outputs the data. In addition, the write buffer 140 is used as a data cache. That is, when the write buffer 140 stores the data accessed from the control logic 170, it may output the data through the data input/output buffer 160. The write buffer 140 includes a failed bit information register 150 that stores information about memory cells having failed bits (failed bit memory cells) identified by the write & verify driver 130. That is, the failed bit memory cells are those memory cells that are determined to have failed the program operation as determined by a subsequent verify operation.

The data input/output buffer 160 supplies externally input data to the write buffer 140 or outputs data read from a read circuit to the outside.

The control logic 170 outputs control signals for controlling the resistive memory device 100 according to an externally applied command signal CMD. In addition, the control logic 170 controls the operation of the write & verify driver 130 during a write operation. In particular, the control logic 170 supplies a SET pulse and a RESET pulse for generating a program current during the write operation to the write buffer 140. The control logic 170 supplies a bias voltage DC_BIAS for controlling an amount of current supplied to multi bit cells to the write buffer 140. In addition, the control logic 170 sorts information regarding failed bit memory cells (failed bit memory cell information) according to results of the verify operation performed by the write & verify driver 130. In an exemplary embodiment, the failed bit memory cell information may include address information (e.g., column addresses and/or row addresses) of the failed bit memory cells in the memory device 100.

In addition, the control logic 170 selects write drivers of the write & verify driver 130 based on the failed bit memory cell information stored in the failed bit information register 150 and the maximum operation current, which is determined at the time of manufacturing the resistive memory device. In particular, the control logic 170 may select at least one first write driver from among the write drivers in the write & verify driver 130 to perform a first program operation on the resistive memory cells. A corresponding verify driver of the write & verify driver 130 verifies whether the resistive memory cells have passed or failed the first program operation and sorts information about the failed bit memory cells. The sorted failed bit memory cell information is stored in the failed bit information register 150. In addition, the control logic 170 may select at least one second write driver from among the write drivers in the write & verify driver 130 operable with the maximum operation current corresponding to the sorted failed bit memory cell information (e.g., sorted addresses of the failed bit memory cells) to perform a second program operation. According to various embodiments, a second program operation current may be the same as or lower than a first program operation current of the first program operation. Alternatively, the second program operation current may be higher than the first program operation current. Therefore, the first write driver(s) selected in a first program operation loop and the second write driver(s) selected in a second program operation loop may overlap.

FIG. 3 is a block diagram of a resistive memory device, according to embodiments of the inventive concept. For convenience of explanation, Although FIG. 3 shows a resistive memory device including 16 memory banks, for purposes of illustration, aspects of the inventive concept are not limited thereto.

Referring to FIG. 3, the resistive memory includes a memory cell array, read/write circuits 2_1 to 2_8, and a peripheral circuit region (PERIPHERY) 3.

The memory cell array includes representative memory banks 1_1 to 1_16. Each of the memory banks 1_1 to 1_16 includes a plurality of memory blocks BLK0 to BLK7, each and of the memory blocks BLK0 to BLK7 may include a plurality of resistive memory cells (not shown) arranged in a matrix configuration. Although the depicted embodiment shows eight memory blocks in each of the memory banks 1_1 to 1_16, for purposes of illustration, aspects of the inventive concept are not limited thereto. In addition, although not shown, row select circuits and column select circuits defining rows and columns of resistive memory cells to be written/read are arranged to correspond to the memory banks 1_1 to 1_16.

The read/write circuits 2_1 to 2_8 may be included in the above-described write & verify driver (130 of FIG. 2). In addition, each of the read/write circuits 2_1 to 2_8 as shown are arranged to correspond to two memory banks, for purposes of illustration, and to perform read and write operations in the corresponding memory banks. However, aspects of the inventive concept are not limited thereto. That is, in alternative configurations, each the read/write circuits 2_1 to 2_8 may be arranged to correspond to one or to four or more memory banks.

The peripheral circuit region 3 may include multiple logic circuit blocks and a voltage generator for operating various circuit blocks (e.g., read/write circuits 2_1 to 2_8, etc.), for example.

Figure 4A:
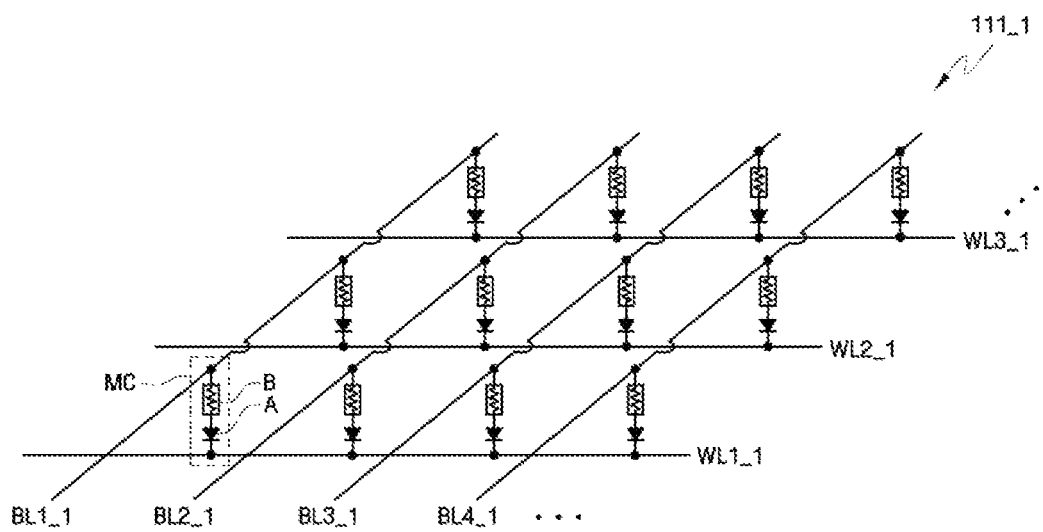
FIGS. 4A and 4B are diagrams illustrating structures of the memory cell array shown in FIGS. 2 and 3, according to an embodiment of the inventive concept.
Figure 4B:
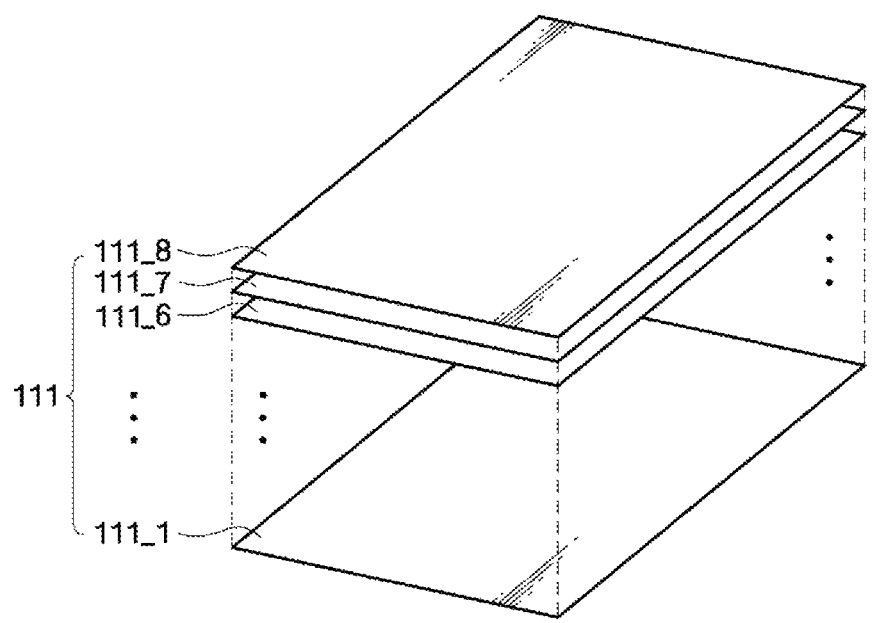

FIGS. 4A and 4B are diagrams illustrating structures of the memory cell array shown in FIGS. 2 and 3, according to an embodiment of the inventive concept.

Referring to FIG. 4A, the memory cell array may have a cross point structure. The cross point structure is a structure in which a memory cell is formed at an intersection of two lines. For example, in representative memory cell layer 111_1, bit lines BL1_1 to BL4_1 are formed to extend in a first direction, word lines WL1_1 to WL3_1 are formed to extend in a second direction so as to cross the bit lines BL1_1 to BL4_1, and resistive memory cells MC are formed at intersections of bit lines BL1_1 to BL4_1 and the word lines WL1_1 to WL3_1, respectively.

As shown in FIG. 4B, the memory cell array may also have a three-dimensional (3D) stacked structure. The 3D stacked structure is a structure in which multiple memory cell layers 111_1 to 111_8 are vertically stacked. Although eight memory cell layers 111_1 to 111_8 are shown stacked vertically in FIG. 4B, for purposes of illustration, aspects of the inventive concept are not limited thereto. Here, each of the memory cell layers 111_1 to 111_8 may include multiple memory cell groups and/or multiple redundancy memory cell groups. When the memory cell array has a 3D stacked structure, each of the memory cell layers 111_1 to 111_8 may have a cross point structure as shown in FIG. 4A, for example, although aspects of the inventive concept are not limited thereto.

The resistive memory cells MC shown in FIG. 4A are resistive memory cells selected among the multiple resistive memory cells in the memory cell array, for example, resistive memory cells selected for read or program operations. Here, when the resistive memory cells MC are PRAMs, each of the resistive memory cells MC may include a variable resistive element B including a phase change material, and an access element A controlling the current flowing through the variable resistive element B. The access element A may be a diode or a transistor connected to the variable resistive element B in series, for example. In addition, the phase change material may have a different resistance value according to whether it is in a crystalline state or an amorphous state. For example, the phase-change material may be a combination of two elements, such as GaSb, InSb, InSe, $Sb_2Te_3$ or GeTe, a combination of three elements, such as GeSbTe, GaSeTe, InSbTe, $SnSb_2Te_4$ or InSbGe, or a combination of four elements such as AgInSbTe, (GeSn)SbTe, GeSb(SeTe) or $Te_{81}Ge_{15}Sb_2S_2$. For purposes of illustration, it may be assumed that the phase-change material is formed of GeSbTe, which includes germanium (Ge), antimony (Sb) and tellurium (Te).

Meanwhile, when the resistive memory cells MC are RRAMs, the variable resistive element B may include, for example, NiO or perovskite. The perovskite may be a composition of manganite (such as $Pr_{0.7}Ca_{0.3}MnO_3$, $Pr_{0.5}Ca_{0.5}MnO_3$, PCMO, and LCMO), titanate (such as STO: Cr), and/or zirconate (such as SZO:Cr, $Ca_2Nb_2O_7$:Cr, and $Ta_2O_5$:Cr).

Figure 5:
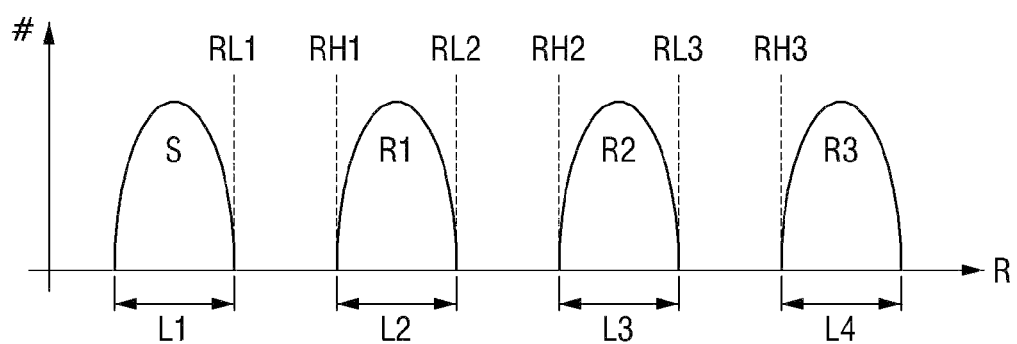
FIG. 5 illustrates a resistance distribution of resistive memory cells used in the resistive memory device, according to embodiments of the inventive concept.

FIG. 5 illustrates a resistance distribution of resistive memory cells used in the resistive memory device, according to embodiments of the inventive concept. In FIG. 5, the X axis indicates resistance value, and the Y axis indicates the number of memory cells.

For example, a memory cell may store $2^N$ bits (where N is a natural number) and may include a variable resistance element including a phase change material having a resistance level that can be varied by an electrical pulse. Referring to FIG. 5, when each memory cell stores 2 bits, for example, the variable resistance element may have four resistance distributions. The resistance distributions of the variable resistance element may be implemented by adjusting the amount of amorphous material contained in the phase change material. A memory cell having four resistance distributions may be programmed to have one of the four resistance distributions.

Generally, the more amorphous material contained in the phase change material, the higher the resistance value. Thus, a first resistance distribution S is a resistance distribution of a crystalline state in which the resistance value is lowest, and a fourth resistance distribution $R_3$ is a resistance distribution of an amorphous state in which the resistance value is highest. A second resistance distribution $R_1$ is a resistance distribution greater than the first resistance distribution S and smaller than a third resistance distribution $R_2$, which is greater than the second resistance distribution $R_1$ and smaller than the fourth resistance distribution $R_3$. In particular, the first resistance distribution S is smaller than resistance level RL1. The second resistance distribution $R_1$ is greater than resistance level RH1 and smaller than resistance level RL2. The third resistance distribution $R_2$ is greater than resistance level RH2 and smaller than resistance level RL3. The fourth resistance distribution $R_3$ is greater than resistance level RH3. Therefore, resistance levels RL1, RL2, RL3, RH1, RH2 and RH3 may serve as reference values used in a write verify operation for verifying whether or not a write operation is accurately performed.

In addition, in order to obtain a read margin, the respective first through fourth resistance distributions S, $R_1$, $R_2$ and $R_3$ have non-overlapping resistor ranges. The respective resistance distributions S, $R_1$, $R_2$ and $R_3$ may respectively correspond to data 00, 01, 10 and 11. In an embodiment, the resistance level may increase in an order of data 11, 01, 00 and 10. That is, in an embodiment of the inventive concept, the first resistance distribution S may correspond to data 11, the second resistance distribution $R_1$ may correspond to data 01, the third resistance distribution $R_2$ may correspond to data 00, and the fourth resistance distribution $R_3$ may correspond to data 10.

Figure 6:
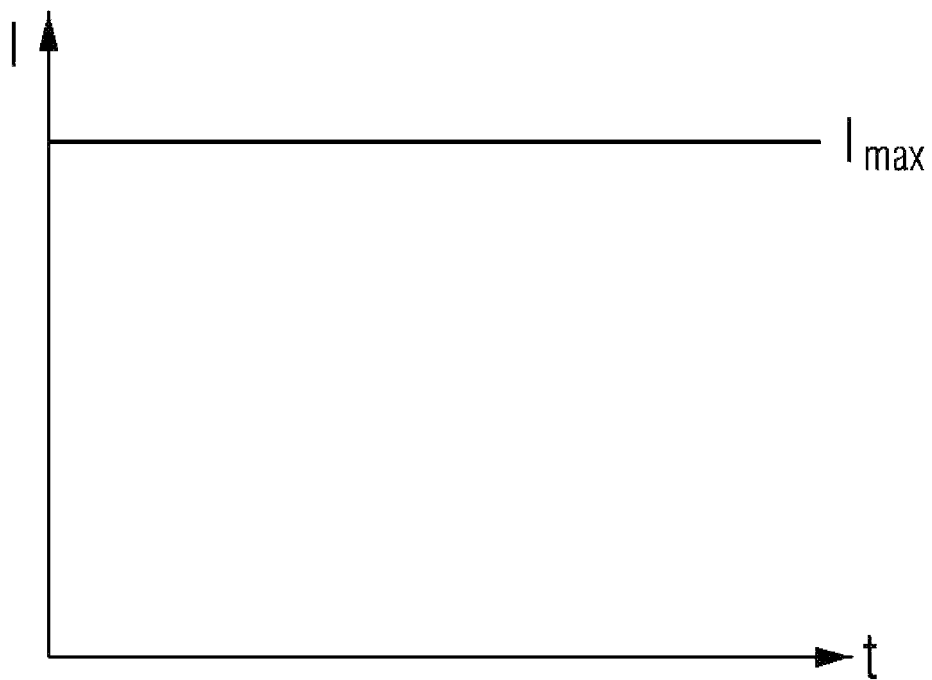
FIG. 6 illustrates a maximum operation current (Imax) capable of operating a resistive memory device, according to an embodiment of the inventive concept.

FIG. 6 illustrates a maximum operation current (Imax) capable of operating a resistive memory device, according to embodiments of the inventive concept. In FIG. 6, the X axis indicates time and the Y axis indicates current.

Referring to FIG. 6, the resistive memory device uses a current as an operation source, and a maximum operation current $I_{max}$ is determined at the time of manufacturing the resistive memory device. Therefore, the maximum operation current $I_{max}$ has a constant value. In addition, the resistive memory device may not be able to use a current exceeding the maximum operation current. When the resistive memory device uses a considerably small current, compared to the maximum operation current $I_{max}$, there may be a considerable power loss.

Figure 7:
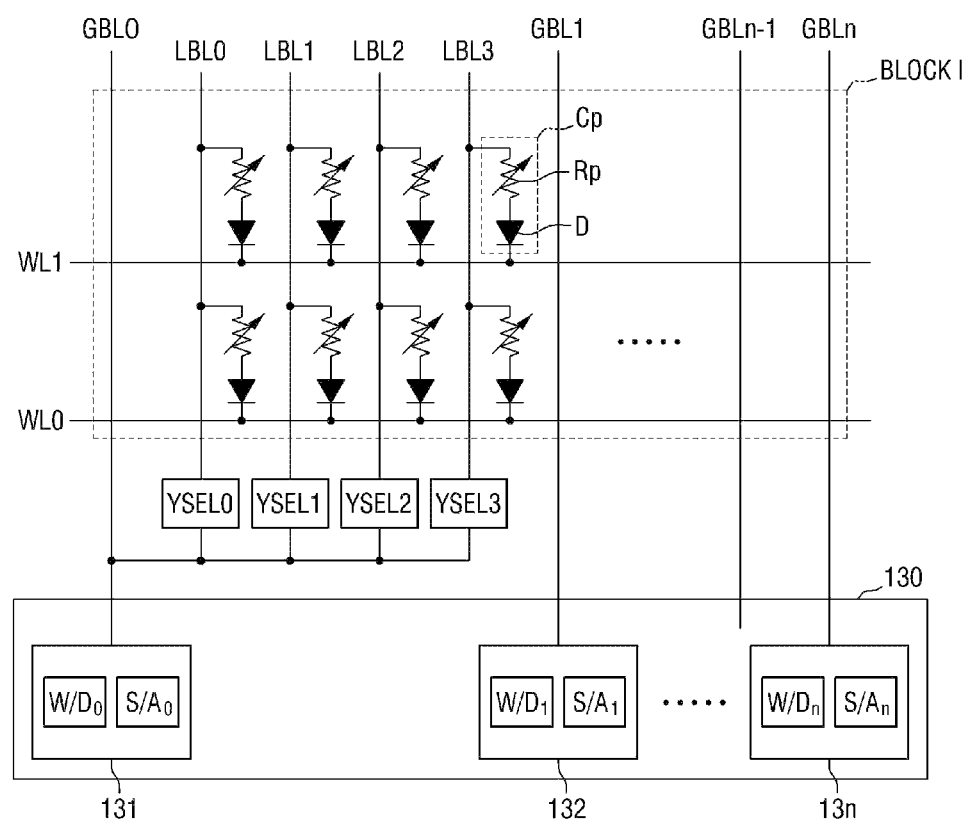
FIG. 7 is a conceptual diagram illustrating memory cells and write & verify drivers, according to embodiments of the inventive concept.

FIG. 7 is a conceptual diagram illustrating memory cells and write & verify drivers, according to embodiments of the inventive concept.

Referring to FIG. 7, a memory block BLK0 includes phase change memory cells Cp, global bit lines GBL0 to GBLn, bit lines LBL0, LBL1, LBL2 and LBL3, word lines WL0 and WL1, and column select transistors YSEL0 to YSEL3. The write & verify driver 130 includes multiple write & verify driver units 131 to 13n corresponding to the global bit lines GBL0 to GBLn, respectively, as discussed below.

The phase change memory cells Cp are respectively positioned at intersections of the word lines WL0 and WL1 and the bit lines LBL0, LBL1, LBL2 and LBL3. In particular, the bit lines LBL0, LBL1, LBL2 and LBL3 may be branched from the global bit lines GBL0 to GBLn, respectively, to have a hierarchical bit line structure. In more detail, the global bit lines GBL0 to GBLn are formed to extend in one direction to be shared by the memory blocks (BLK0 to BLK7). The bit lines LBL0, LBL1, LBL2 and LBL3 are selectively connected to the global bit lines GBL0 to GBLn through the column select transistors YSEL0 to YSEL3, respectively, and the phase change memory cells Cp are connected to the bit lines LBL0, LBL1, LBL2 and LBL3, respectively.

The phase change memory cells Cp change from a crystalline state or an amorphous state in response to current flowing through the phase change memory cells Cp. Each of the phase change memory cells Cp includes a phase change material Rp having different resistance values for the respective states and an access element D controlling the current flowing through the phase change material Rp.

The column select transistors YSEL0 to YSEL3 selectively connect the global bit lines GBL0 to GBLn to the bit lines LBL0, LBL1, LBL2 and LBL3 in response to a column select signal. Here, the column select signal may be a signal obtained by decoding column address and block information.

Write & verify driver units 131 to 13n are connected to the global bit lines GBL0 to GBLn, respectively. Each of the write & verify driver units 131 to 13n includes a write driver W/D and a sense amplifier (or verify driver) S/A for verify operations. That is, the write & verify driver units 131 to 13n include write drivers W/D0 to W/Dn and sense amplifiers S/A0 to S/An, respectively. The write drivers W/D0 to W/Dn supply program current to resistive memory cells to program data. In addition, as shown in FIG. 6, the write drivers W/D0 to W/Dn may be selected based on the maximum operation current. First write drivers are selected based on the maximum operation current to then perform a first program operation on memory cells connected to the first write drivers. The column select transistors YSEL0 to YSEL3 select the bit lines LBL0, LBL1, LBL2 and LBL3 in response to the column select signal to be programmed in the memory cells. The sense amplifiers S/A0 to S/An verify whether the first program operation is passed or failed for the memory cells, and sort information about the failed bit memory cells. Among the write drivers corresponding to the failed bit memory cells (the memory cells for which the program operation fails), identified by the sorted failed bit memory cell information, second write drivers are selected based on the maximum operation current. The second write drivers supply the program current to the nonvolatile memory cells to perform a second program operation, described below with reference to FIGS. 9 to 11.

The number of the selected first write drivers may be obtained by dividing the maximum operation current by a current value applied during the first program operation. Likewise, the number of the selected second write drivers is obtained by dividing the maximum operation current by a current value applied during the second program operation.

Figure 8:
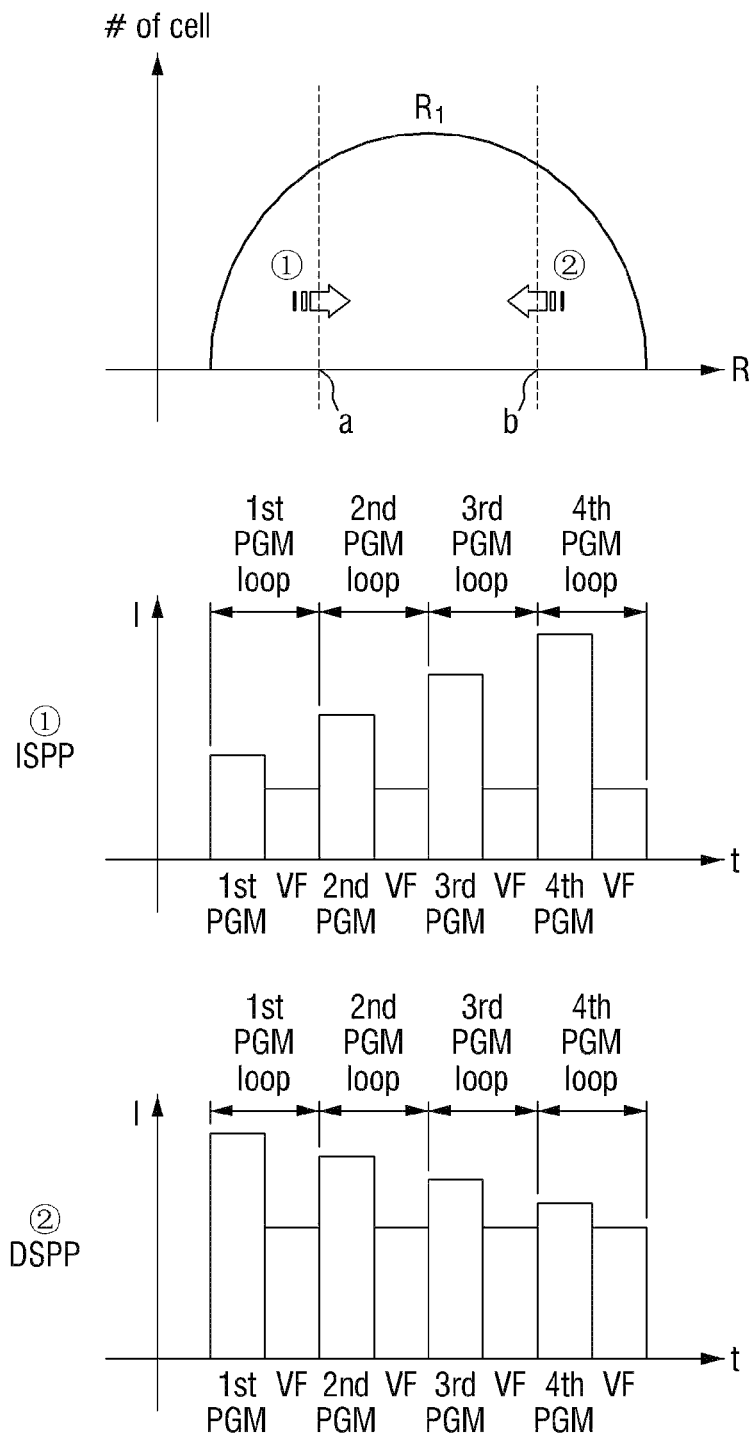
FIG. 8 illustrates exemplary resistance distribution and programming methods of resistive memory cells according to embodiments of the inventive concept.

FIG. 8 illustrates exemplary resistance distribution and programming methods of resistive memory cells, according to embodiments of the inventive concept.

In case ① of FIG. 8, program operations are performed in a direction in which resistance increases. In particular, in case ① of FIG. 8, the program current values increase with the increase in the number of program loops using an increment step pulse program (ISPP) in which a program current is incremented based on the program loop. In addition, the program current is applied and a constant verify current is applied to verify whether a program is passed or failed.

In case ② of FIG. 8, program operations are performed in a direction in which resistance decreases. In particular, in case ② of FIG. 8, the program current value is decremented with the increase in the number of program loops using a decrement step pulse program (DSPP) in which a program current decreases based on the program loop. In addition, the program current is applied and a constant verify current is applied to verify whether a program is passed or failed.

Figure 9A:
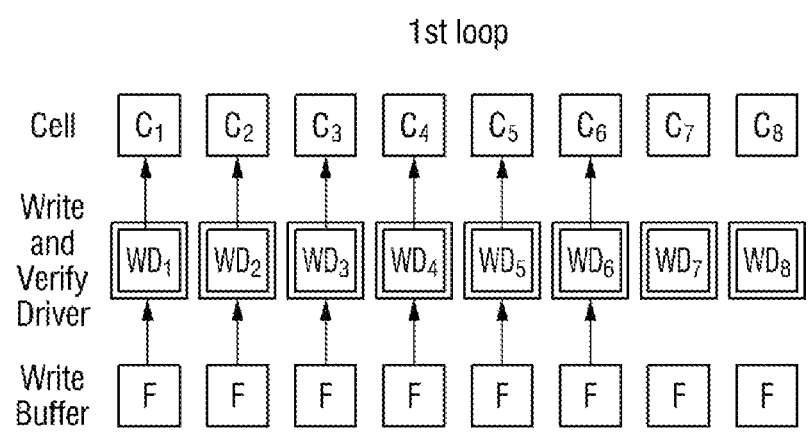
FIGS. 9A and 9B are conceptual diagrams illustrating program methods in multiple program loops of a resistive memory device, according to an embodiment of the inventive concept.
Figure 9B:
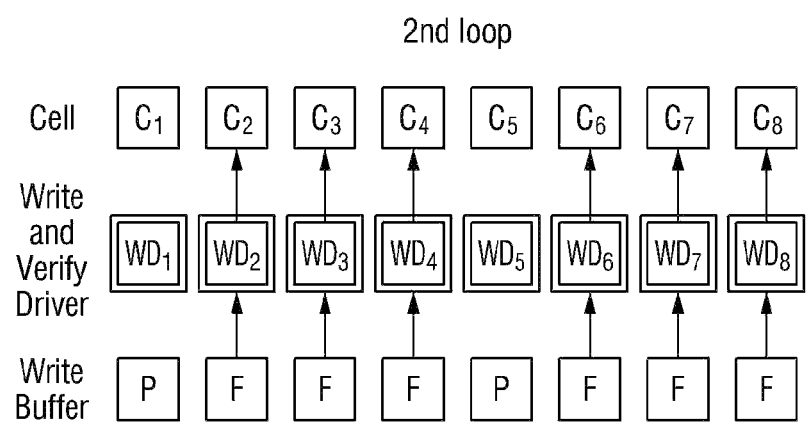

FIGS. 9A and 9B are conceptual diagrams illustrating programming methods in multiple loops of a resistive memory device, according to an embodiment of the inventive concept. FIGS. 9A and 9B illustrate memory cells C1 to C8, write (and verify) drivers WD1 to WD8, and write buffers.

FIG. 9A illustrates operations of first write drivers WD1, WD2, WD3, WD4, WD5 and WD6 selected in a first program loop. The control logic (170 of FIG. 2) refers to program pass or fail information of the memory cells stored in the write buffer (140 of FIG. 2) and selects operable first write drivers WD1, WD2, WD3, WD4, WD5 and WD6 based on the maximum operation current (see FIG. 6.), and the selected first write drivers WD1, WD2, WD3, WD4, WD5 and WD6 perform program operations on the memory cells C1, C2, C3, C4, C5 and C6, respectively.

In addition, verify drivers (corresponding to the first write drivers) verify whether the first program operation is passed or failed with regard to the memory cells C1, C2, C3, C4, C5 and C6, respectively, thereby sorting information of the failed bit memory cells. In an exemplary embodiment, the failed bit memory cell information may include column addresses or row addresses as addresses of the memory device. The sorted failed bit memory cell information is stored in the write buffer 140.

The maximum operation current is a predetermined current determined at the manufacturing time of the resistive memory device, and the resistive memory device may not be able to use a current exceeding the maximum operation current.

FIG. 9B illustrates operations of second write drivers WD2, WD3, WD4, WD6, WD7 and WD8 selected in a second program loop. The control logic (170 of FIG. 2) identifies addresses of the sorted failed bit memory cells shown in FIG. 9A based on the failed bit memory cell information, and selects the second write drivers WD2, WD3, WD4, WD6, WD7 and WD8 based on the maximum operation current to perform the second program operation. Referring to FIG. 9B, the second write drivers WD2, WD3, WD4, WD6, WD7 and WD8 corresponding to the failed memory cells C2, C3, C4, C6, C7 and C8 may be selected based on the maximum operation current (see FIG. 6). The second write drivers WD2, WD3, WD4, WD6, WD7 and WD8 perform program operations on the failed memory cells C2, C3, C4, C6, C7 and C8.

In the depicted example, the first write drivers WD1, WD2, WD3, WD4, WD5 and WD6 and the second write drivers WD2, WD3, WD4, WD6, WD7 and WD8 use the same program current during corresponding first and second program operations, and the number (e.g., six) of the first write drivers WD1, WD2, WD3, WD4, WD5 and WD6 are equal to the number (e.g., six) of the second write drivers WD2, WD3, WD4, WD6, WD7 and WD8. In addition, in the first program operation and the second program operation, data of the same logic state $R_1$, $R_2$ or $R_3$ may be programmed.

Figure 10A:
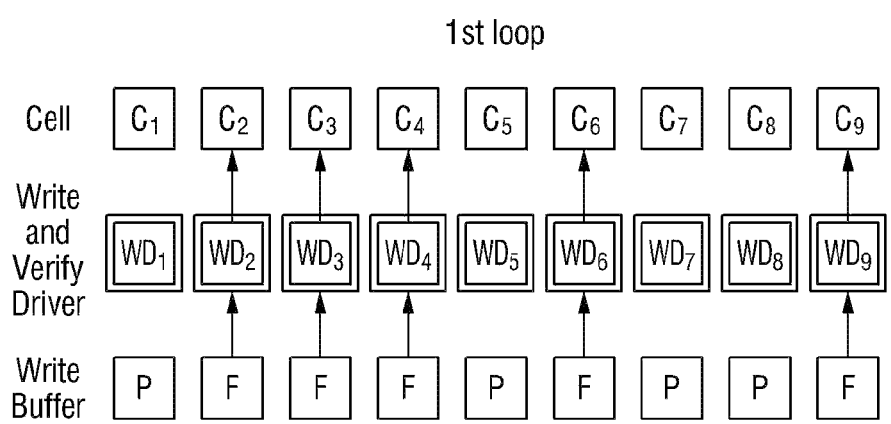
FIGS. 10A to 10C are conceptual diagrams illustrating program methods in multiple program loops of a resistive memory device, according to another embodiment of the inventive concept.
Figure 10B:
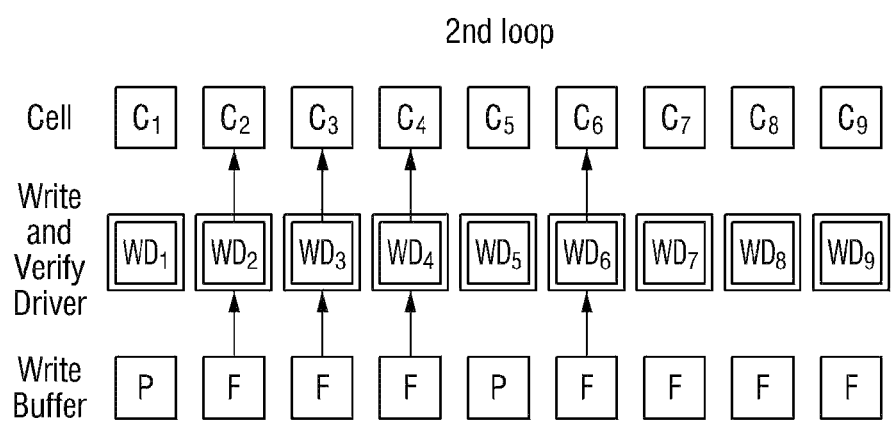
Figure 10C:
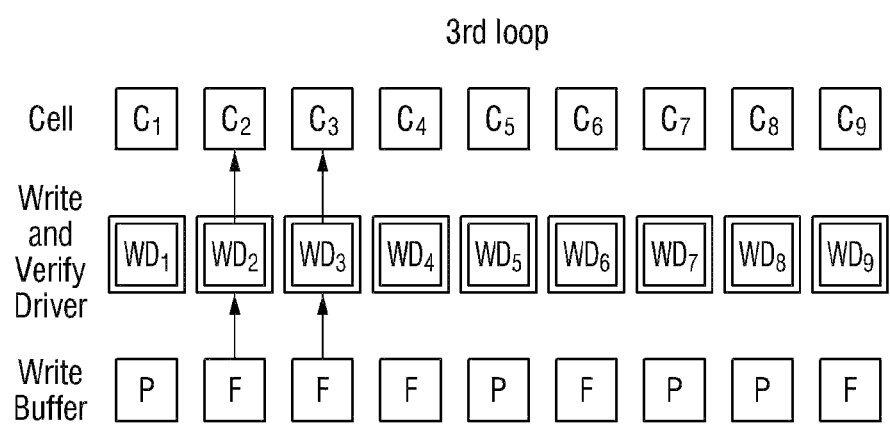

FIGS. 10A to 10C are conceptual diagrams illustrating program methods in multiple program loops of a resistive memory device, according to another embodiment of the inventive concept. For the convenience of explanation, FIGS. 10A to 10C will be described with reference to FIGS. 6 to 8. FIGS. 10A to 10C illustrate memory cells C1 to C9, write (and verify) drivers WD1 to WD9, and write buffers.

FIG. 10A illustrates operations of first write drivers WD2, WD3, WD4, WD6 and WD9 selected in a first program loop. The control logic (170 of FIG. 2) refers to program pass or fail information of the memory cells stored in the write buffer (140 of FIG. 2) and selects operable first write drivers WD2, WD3, WD4, WD6 and WD9 based on the maximum operation current (see FIG. 6.). The selected first write drivers WD2, WD3, WD4, WD6 and WD9 perform program operations on the memory cells C2, C3, C4, C6 and C9, respectively. That is, when it is determined that five first write drivers WD2, WD3, WD4, WD6 and WD9, for example, are operable, based on the maximum operation current, the five first write drivers WD2, WD3, WD4, WD6 and WD9 are operated.

The corresponding verify drivers verify whether the first program operation is passed or failed, and sorts information about the failed bit memory cells. In an exemplary embodiment, the failed bit memory cell information may include corresponding column addresses and/or row addresses as the addresses of the memory device. The failed bit memory cell information may be stored in the write buffer. The maximum operation current is a predetermined current and may be determined at the time of manufacturing the resistive memory device shown in FIG. 6. The resistive memory device may not be able to use a current exceeding the maximum operation current.

FIG. 10B illustrates operations of second write drivers WD2, WD3, WD4 and WD6 selected in a second program loop. The control logic (170 of FIG. 2) selects the second write drivers WD2, WD3, WD4 and WD6 corresponding to the addresses from the sorted failed bit memory cell information in FIG. 10A based on the maximum operation current, and performs a second program operation. Referring to FIG. 10B, the second write drivers WD2, WD3, WD4 and WD6 corresponding to the failed bit memory cells C2, C3, C4 and C6 may be selected based on the maximum operation current. The second write drivers WD2, WD3, WD4 and WD6 perform program operations on the failed bit memory cells C2, C3, C4 and C6. The maximum operation current is a predetermined current having a constant value determined at the manufacturing time of the resistive memory device shown in FIG. 6.

A higher program current may be used in the second program loop than that used in the first program loop. As in case ① of FIG. 8, the program current value may increase by a constant step amount with the increase in the number of program loops. In this case, the number (e.g., 4) of second write drivers may be less than the number (e.g., 5) of first write drivers. In addition, data of the same logic state ($R_1$, $R_2$ or $R_3$) are programmed in the first program operation and the second program operation.

The verify drivers verify whether the second program operation is passed or failed, thereby sorting information about the failed bit memory cells. In an exemplary embodiment, the failed bit memory cell information may include column addresses and/or row addresses as the addresses of the memory device. The sorted failed bit memory cell information is stored in the write buffer 140.

FIG. 10C illustrates operations of third write drivers WD2 and WD3 selected in a third program loop. The control logic (170 of FIG. 2) selects the third write drivers WD2 and WD3 corresponding to the addresses from the sorted failed bit memory cell information in FIG. 10B based on the maximum operation current and performs a third program operation. Referring to FIG. 10C, the third write drivers WD2 and WD3 corresponding to the failed bit memory cells C2 and C3 may be selected based on the maximum operation current. Accordingly, the third write drivers WD2 and WD3 program the memory cells C2 and C3. The maximum operation current is a predetermined current and may be determined at the manufacturing time of the resistive memory device shown in FIG. 6.

A higher program current may be used in the third program loop than in the second program loop. As in case ① of FIG. 8, the program current value may increase by a constant step amount with the increase in the number of program loops. Therefore, the number (e.g., 2) of third write drivers may be less than the number (e.g., 4) of second write drivers.

Figure 11A:
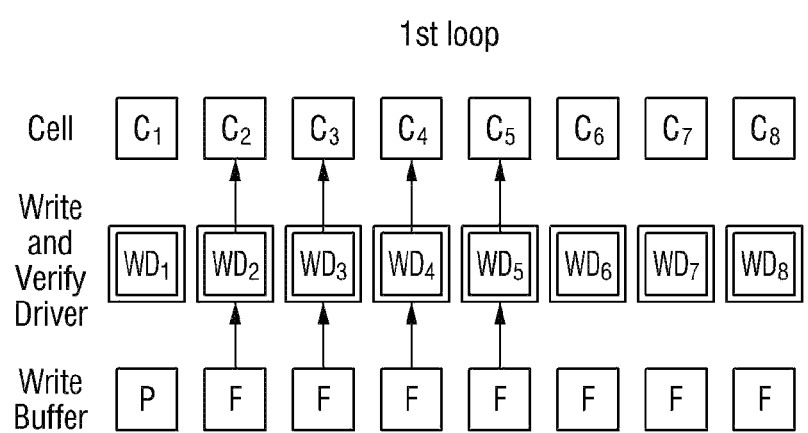
FIGS. 11A and 11B are conceptual diagrams illustrating program methods in multiple program loops of a resistive memory device, according to still another embodiment of the inventive concept.
Figure 11B:
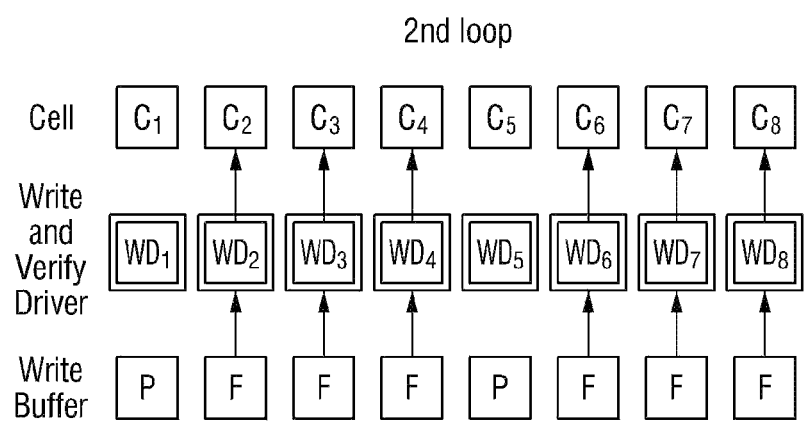

FIGS. 11A and 11B are conceptual diagrams illustrating program methods in multiple program sections of a resistive memory device, according to still another embodiment of the inventive concept. FIGS. 11A and 11B illustrate memory cells C1 to C8, write (and verify) drivers WD1 to WD8, and write buffers.

FIG. 11A illustrates operations of first write drivers WD2, WD3, WD4 and WD5 selected in a first program loop. The control logic 170 refers to program pass or fail information of the failed bit memory cells stored in the write buffer 140 and selects operable first write drivers WD2, WD3, WD4 and WD5 based on the maximum operation current. The selected first write drivers WD2, WD3, WD4 and WD5 perform program operations on the memory cells C2, C3, C4 and C5, respectively. That is, when it is determined that four first write drivers WD2, WD3, WD4 and WD5, for example, are operable, based on the maximum operation current, the four first write drivers WD2, WD3, WD4 and WD5 are operated.

The verify drivers verify whether the first program operation is passed or failed and sort information about failed bit memory cells. In an exemplary embodiment, the failed bit memory cell information may include column addresses and/or row addresses as the addresses of the memory device. The sorted failed bit memory cell information may be stored in the write buffer. The maximum operation current is a predetermined current and may be determined at the time of manufacturing the resistive memory device. The resistive memory device may not be able to use a current exceeding the maximum operation current.

FIG. 11B illustrates operations of second write drivers WD2, WD3, WD4, WD6, WD7 and WD8 selected in a second program loop. The control logic may select the second write drivers corresponding to addresses of the sorted failed bit memory cells in FIG. 11A to perform a second program operation. Referring to FIG. 11B, the second write drivers WD2, WD3, WD4, WD6, WD7 and WD8 respectively corresponding to the failed memory cells C2, C3, C4, C6, C7 and C8 may be selected based on the maximum operation current. The second write drivers WD2, WD3, WD4, WD6, WD7 and WD8 may perform program operations on the failed bit memory cells C2, C3, C4, C6, C7 and C8, respectively. The maximum operation current is a predetermined current having a constant value determined at the time of manufacturing the resistive memory device shown in FIG. 6.

A lower program current may be used in the second program operation loop than in the first program operation loop. As in case ② of FIG. 8, the program current value may decrease by a constant step amount with the increase in the number of program loops. In this case, the number (e.g., 6) of second write drivers may be larger than the number (e.g., 4) of first write drivers.

The verify drivers verify whether the second program operation is passed or failed, thereby sorting information about failed bit memory cells. In an exemplary embodiment, the failed bit memory cell information may include column addresses and/or row addresses as the addresses of the memory device. The sorted information about the failed bit memory cells is stored in the write buffer.

Figure 12:
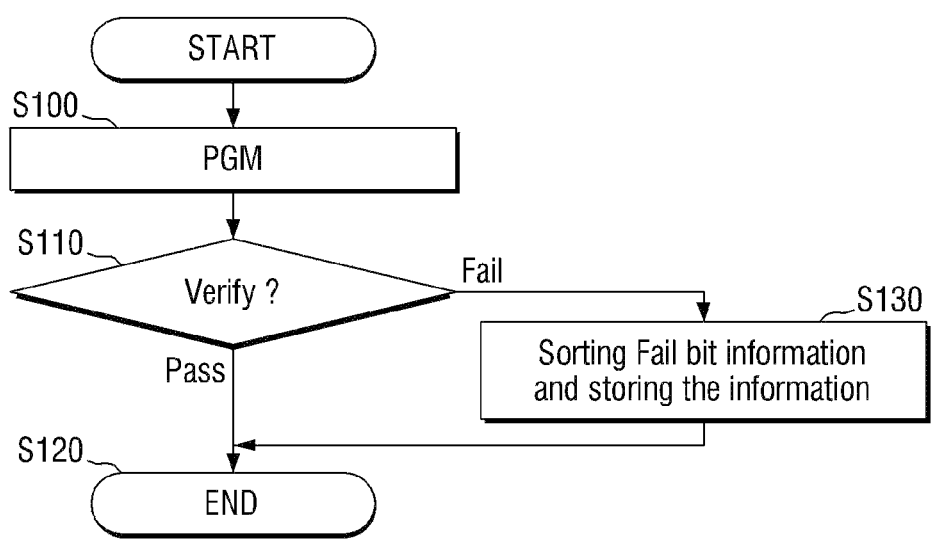
FIG. 12 is a flowchart illustrating a program method of a resistive memory device, according to embodiments of the inventive concept.

FIG. 12 is a flowchart illustrating a method of programming a resistive memory device, according to embodiments of the inventive concept.

Referring to FIG. 12, the resistive memory device programs a particular state in memory cells (S100). Then, the verify driver verifies whether each of the memory cells has passed or failed in the programming (S120). When the memory cells are verified as pass memory cells, the process ends (S120). When the memory cells are not verified as pass memory cells, the memory cells are determined to be failed bit memory cells and information about the failed bit memory cells is sorted and stored in the write buffer (S130). The failed bit memory cells then return to the program step (S100). The steps are repeated until it is verified that the program is passed.

Figure 13:
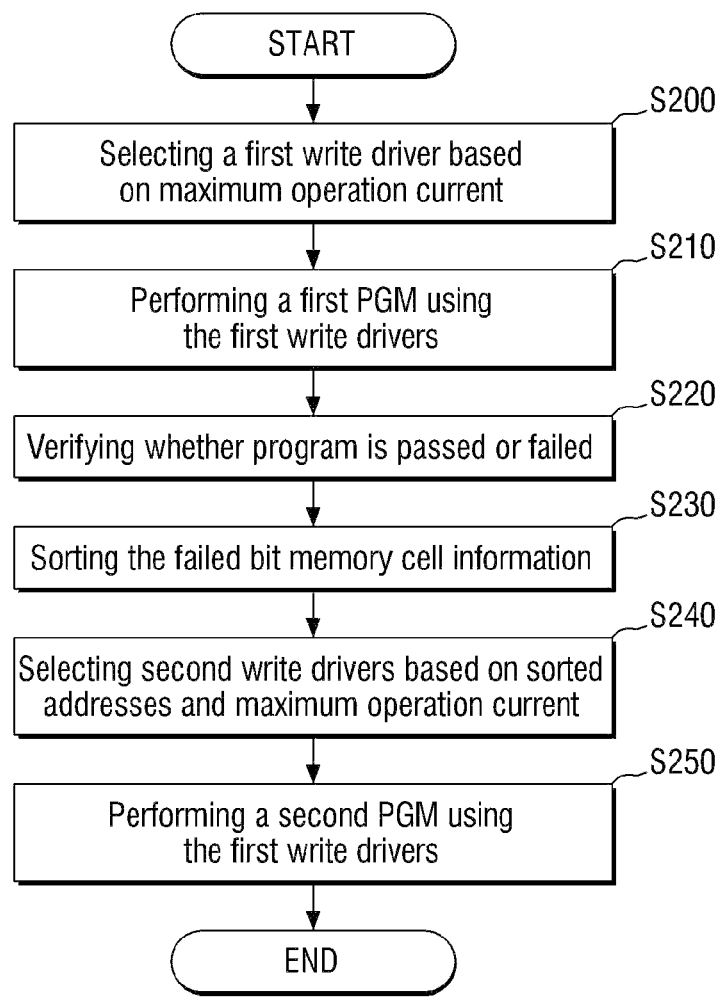
FIG. 13 is a flowchart illustrating a program method of a resistive memory device according to an embodiment of the inventive concept.

FIG. 13 is a flowchart illustrating a method of programming a resistive memory device, according to an embodiment of the inventive concept.

Referring to FIG. 13, the resistive memory device selects first write drivers based on a predetermined current (S200). The predetermined current is a maximum operation current determined at the time of manufacturing the resistive memory device, as shown in FIG. 6. Then, a first program operation (first program loop) is performed on resistive memory cells corresponding to the first write drivers (S210). It is verified whether the first program operation of each of the memory cells is passed or failed (S220), and then information about the failed bit memory cells is sorted in a write buffer (S230). The failed bit memory cell information may include column and/or row addresses of the resistive memory device.

Next, second write drivers corresponding to addresses of the failed bit memory cells are selected based on the predetermined current (S240). A second program operation (second program loop) is performed on resistive memory cells corresponding to the second write drivers (S250). Data of the same logic state are programmed in the first program operation and the second program operation.

When the second write drivers are selected, a program current value applied during the second program operation is referred to. When increment step pulse program (ISPP) is used during the second program operation, the number of the second write drivers may be less than the number of the first write drivers. Conversely, when decrement step pulse program (DSPP) is used during the second program operation, the number of the second write drivers may be greater than the number of the first write drivers.

Figure 14:
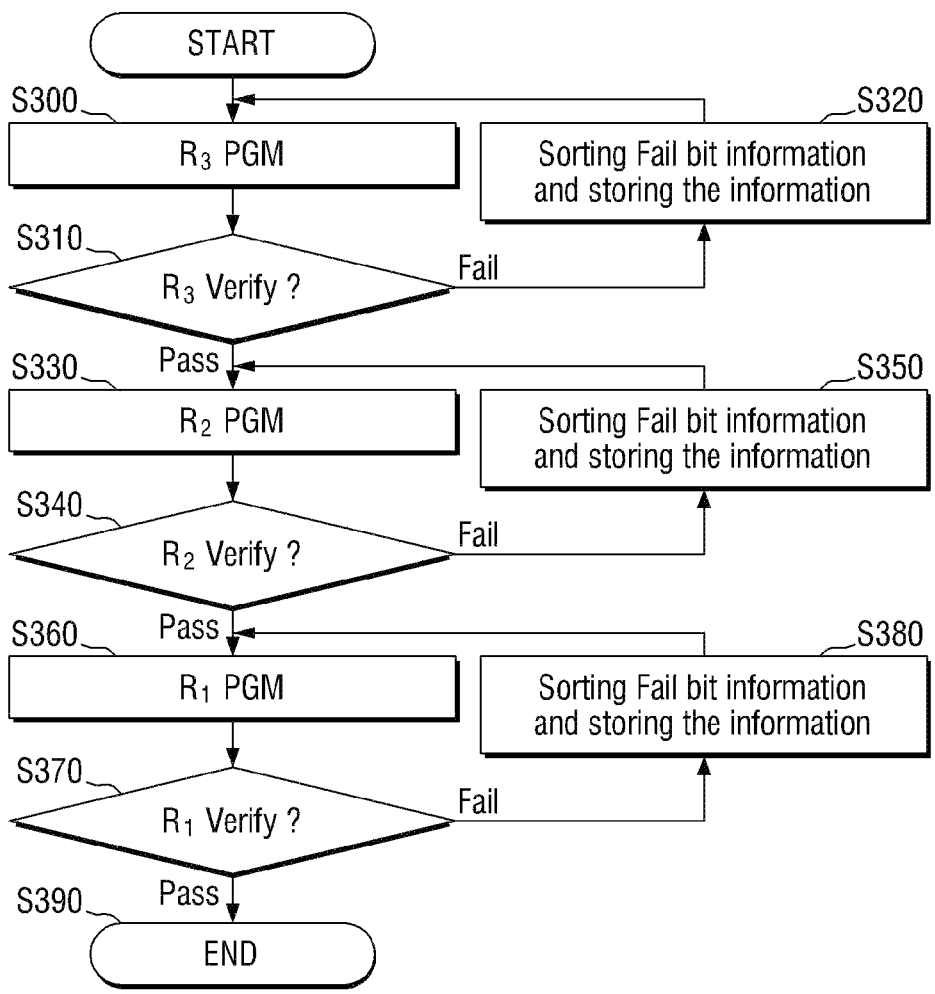
FIG. 14 is a flowchart illustrating a program method of a multi level cell (MLC) resistive memory device, according to an embodiment of the inventive concept.

FIG. 14 is a flowchart illustrating a method of programming a multi level cell (MLC) resistive memory device, according to an embodiment of the inventive concept. In FIG. 14, a program method of a 2-bit resistive memory device is described by way of example. For convenience of explanation, the flowchart shown in FIG. 14 is described with reference to FIGS. 2 and 5 to 7.

Referring to FIG. 14, data is programmed in order from higher resistance state $R_3$ to lower resistance states $R_2$ and $R_1$, although aspects of the inventive concept are not limited thereto.

Data of third state $R_3$ are programmed in the resistive memory cells (S300). Then, the verify driver verifies whether the program operation performed on the memory cells having the third state $R_3$ is passed or failed (S310). When the program operation is failed, the verify driver sorts information about failed bit memory cells and the sorted failed bit memory cell information is stored in the write buffer (S320). Then, the data of third state $R_3$ are programmed again in the failed bit memory cells corresponding to the failed bit memory cell information (S300). This program loop (S300 to S320) is repeatedly performed until it is verified that the programming of the data of third state $R_3$ is passed. When it is verified that the programming of the data of third state $R_3$ is passed, the resistive memory device programs data of second state $R_2$ (S330).

The verify driver verifies whether the program operation performed on the memory cells having the second state $R_2$ is passed or failed (S340). When the program operation is failed, the verify driver sorts information about failed bit memory cells and the sorted failed bit memory cell information is stored in the write buffer (S350). Then, the data of second state $R_2$ are programmed again in the failed bit memory cells corresponding to the failed bit memory cell information (S340). This program loop (S330 to S350) is repeatedly performed until it is verified that the programming of the data of second state $R_2$ is passed. When it is verified that the programming of the data of second state $R_2$ is passed, the resistive memory device programs data of first state $R_1$ (S360).

The verify driver verifies whether the program operation of the memory cells having the first state $R_1$ is passed or failed (S370). When the program operation is failed, the verify driver sorts information about failed bit memory cells and the sorted failed bit memory cell information is stored in the write buffer (S380). Then, the data of first state $R_1$ are programmed again in the failed bit memory cells corresponding to the failed bit memory cell information (S360). This program loop (S360 to S380) is repeatedly performed until it is verified that the programming of the data of first state $R_1$ is passed. When it is verified that the programming of the data of first state $R_1$ is passed, the resistive memory device ends the program (S390).

Figure 15:
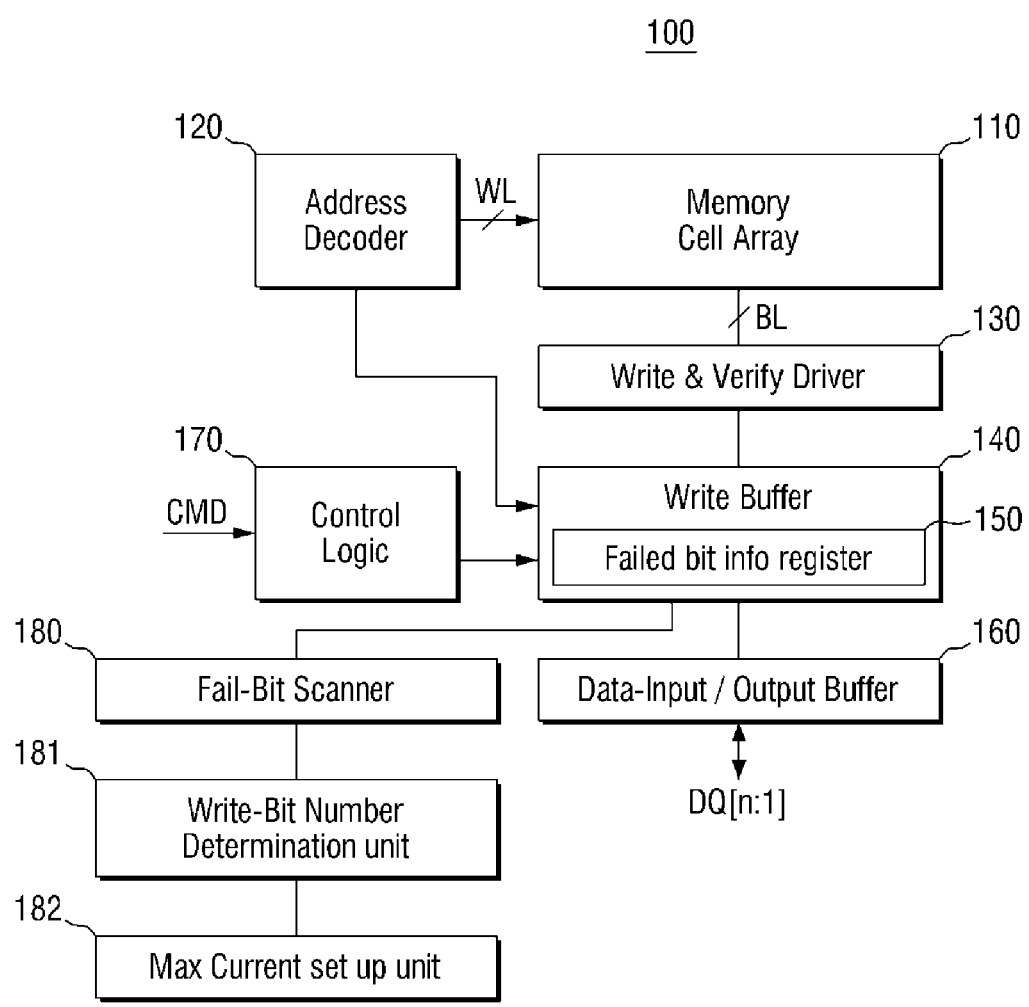
FIG. 15 is a block diagram of the resistive memory device shown in FIG. 1, according to another embodiment of the inventive concept.

FIG. 15 illustrates another example of the resistive memory device shown in FIG. 1, according to an embodiment of the inventive concept.

Referring to FIG. 15, as previously described with reference to FIG. 2, the resistive memory device 100 includes a memory cell array 110, an address decoder 120, a write & verify driver 130, a write buffer 140, a data input/output buffer 160 and control logic 170. In addition, referring to FIG. 15, the resistive memory device 100 includes a fail bit scanner 180, a write-bit number determination unit 181, and a maximum current set up unit 182. Referring to FIGS. 6 and 15, the max current set up unit 182 sets up the maximum current supplied to the memory cell array 110.

The control logic 170 supplies a SET pulse and a RESET pulse for generating a program current during a write operation to the write buffer 140 to perform a first program operation.

The fail-bit scanner 180 sorts pieces of information about failed bit memory cells according to program and verify results. The sorted information about the program-failed bit memory cells is stored in the fail bit information register 150. The write-bit number determination unit 181 selects write drivers of the write & verify driver 130 based on the failed bit memory cell information stored in the fail bit information register 150 and the maximum operation current set up by the maximum current set up unit 182. A second program operation is performed on the resistive memory cells using the selected write drivers 130.

The fail bit scanner 180 sorts the pieces of information about the program-failed bit memory cells based on the second program operation and verify results. The sorted information about the program-failed bit memory cells is stored in the fail bit information register 150.

The write-bit number determination unit 181 selects again the write drivers of the write & verify driver 130 based on the failed bit memory cell information stored in the fail bit information register 150 and the maximum operation current set up by the maximum current set up unit 182. The write drivers selected in a first program operation loop and the write drivers selected in a second program operation loop may overlap.

FIGS. 16 to 20 illustrate memory systems according to embodiments of the inventive concept, and illustrate memory systems using nonvolatile memory devices, according to embodiments of the inventive concept.

Figure 16:
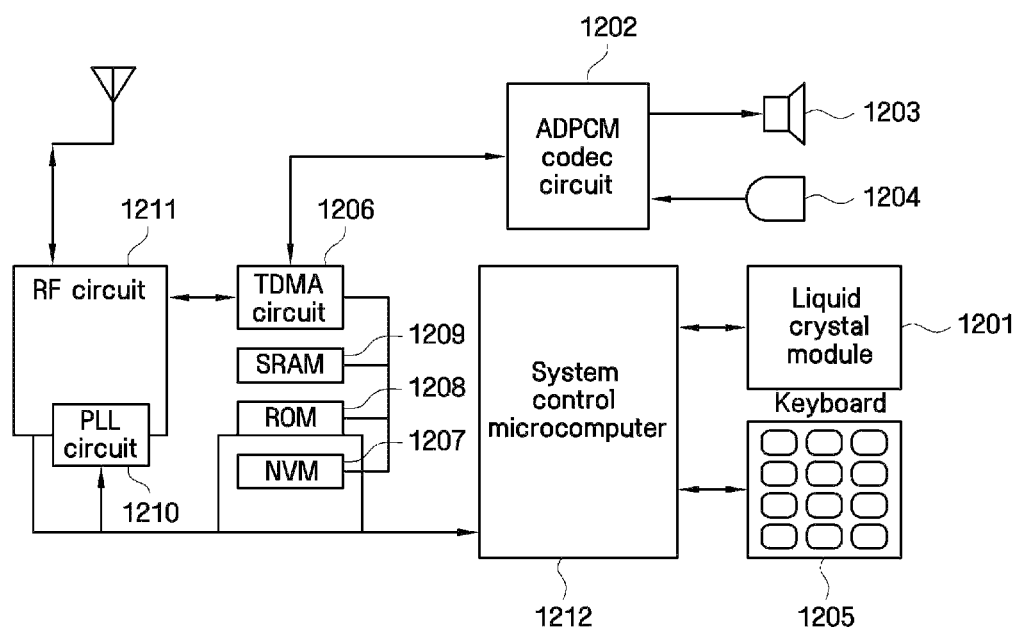
FIGS. 16 to 20 illustrate memory systems, according to embodiments of the inventive concept.

FIG. 16 is an exemplary block diagram of a cellular phone system using a nonvolatile memory device, according to embodiments of the inventive concept.

Referring to FIG. 16, the cellular phone system includes a ADPCM codec circuit 1202 for audio compression or decompression, a speaker 1203, a microphone 1204, a TDMA circuit 1206 for time-divisional multiplexing accessing to digital data, a PLL circuit 1210 for setting a carrier frequency of a radio frequency (RF) signal, and an RF circuit 1211 for transmitting/receiving the RF signal.

In addition, the cellular phone system includes various kinds of memories including, for example, a nonvolatile memory 1207, ROM 1208, and SRAM 1209. The nonvolatile memory 1207 includes nonvolatile memory devices according to embodiments of the inventive concept, and may include, for example, ID number. The ROM 1208 may store programs, and the SRAM 1209 may serve as the working area for a system controlling microcomputer 1212 or may temporarily store data. Here, the system controlling microcomputer 1212 may be a processor controlling write and read operations of the nonvolatile memory 1207. A user may interface with the system controlling microcomputer 1212 using an input device, such as a keyboard 1205, and an output device, such as a liquid crystal module 1201, for example.

Figure 17:
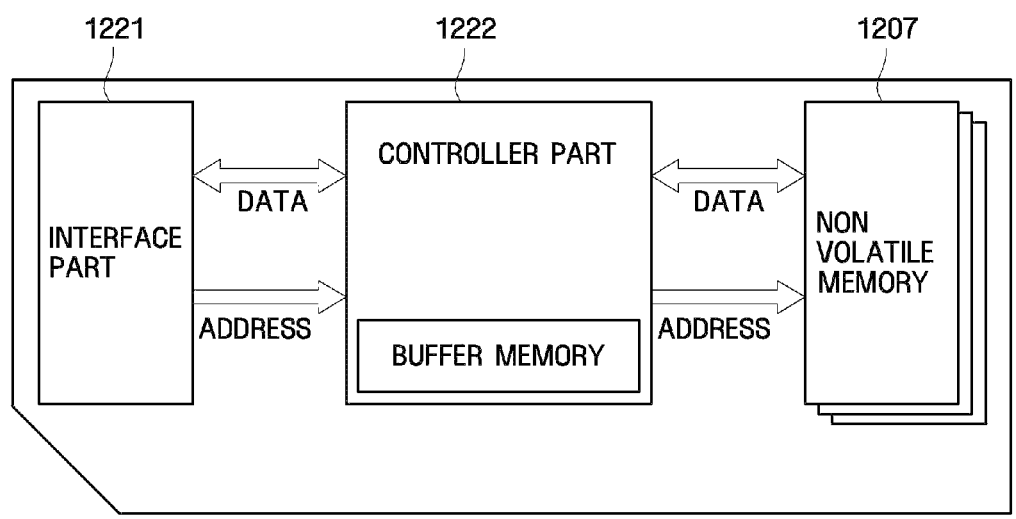

FIG. 17 is a block diagram of an exemplary memory card using a nonvolatile memory device, according to embodiments of the inventive concept.

The memory card may include, for example, a multimedia card (MMC), a secure digital (SD) card, multiuse card, a micro SD card, a multiuse card, such as a memory stick, a compact SD card, an ID card, a personal computer memory card international association (PCMCIA) card, an SSD card, a chip card, a smart card, a USB card, and so on.

Referring to FIG. 17, the memory card includes at least one of an interface part 1221 for interfacing with an external device, a controller part 1222 having a buffer memory and for controlling operation of a memory card, and nonvolatile memory 1207 according to the embodiments of the inventive concept. The controller part 1222 may be a processor capable of controlling the write and read operations of the nonvolatile memory 1207. In particular, the controller part 1222 may be coupled to the nonvolatile memory 1207 and the interface part 1221 through a data bus DATA and an address bus ADDRESS.

Figure 18:
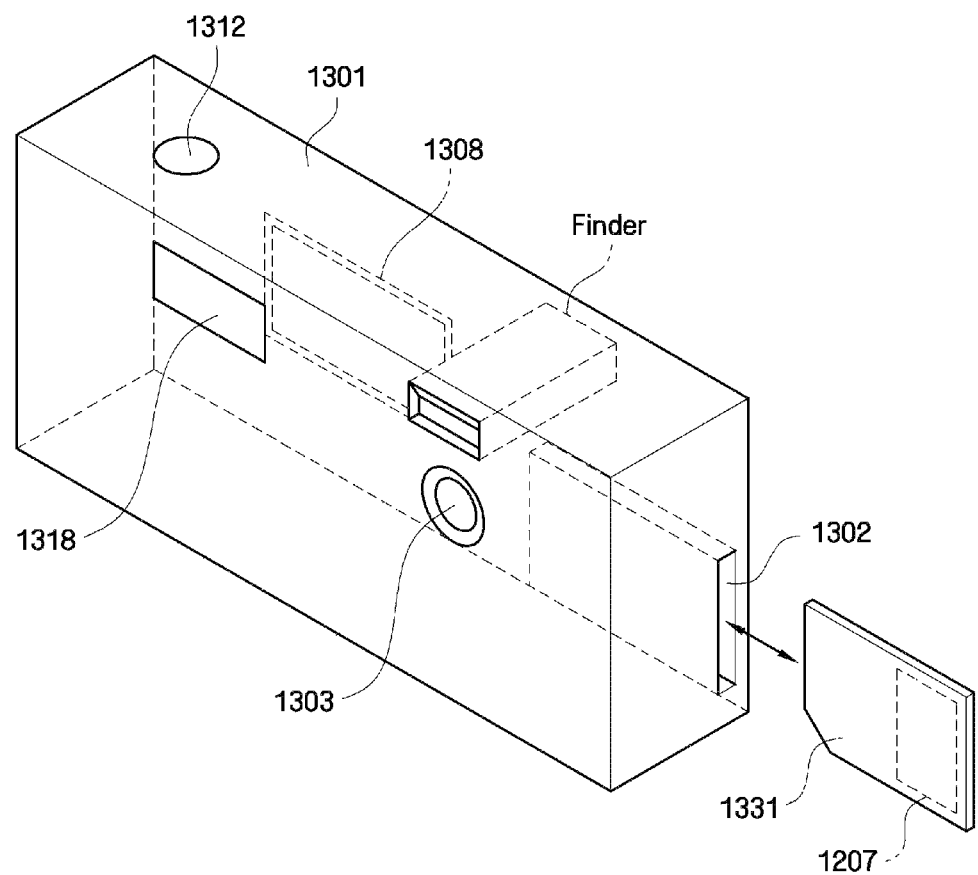

FIG. 18 is an exemplary block diagram of a digital still camera using a nonvolatile memory device, according to embodiments of the inventive concept.

Referring to FIG. 18, the digital still camera includes a body 1301, a slot 1302, a lens 1303, a display 1308, a shutter button 1312, and a strobe 1318. A memory card 1331 is insertable into the slot 1308. The memory card 1331 may include at least one nonvolatile memory 1207, according to embodiments of the inventive concept.

When the memory card 1331 is a contact type memory card, the memory card 1331 may come into contact with a particular electric circuit provided on a circuit board when it is inserted into the slot 1308. When the memory card 1331 is a non-contact type memory card, the memory card 1331 may perform communication through an RF signal, for example.

Figure 19:
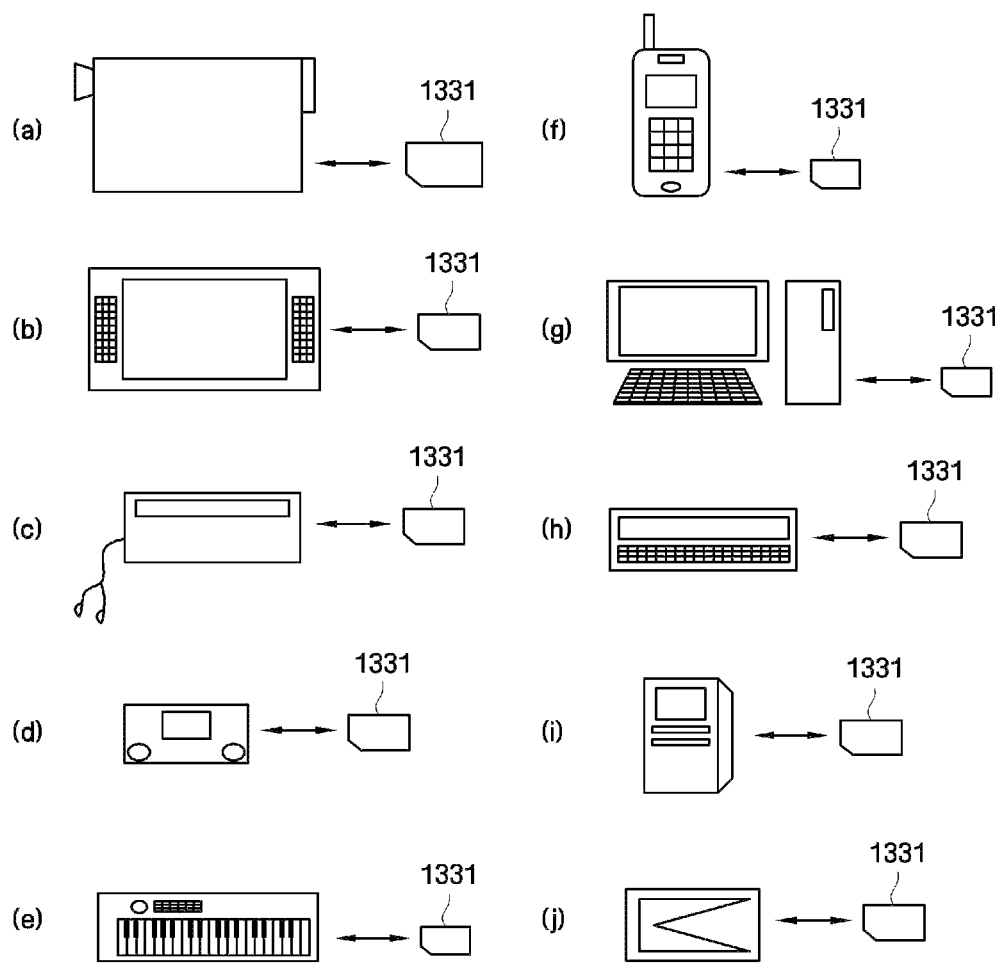

FIG. 19 illustrates various systems using the memory card shown in FIG. 17, according to embodiments of the inventive concept. The memory card is indicated as memory card 1331.

Referring to FIG. 19, the memory card 1331 may be used in various systems including (a) a video camera, (b) a television, (c) an audio device, (d) a game console, (e) an electronic music player device, (f) a mobile phone, (g) a computer, (h) a personal digital assistant (PDA), (i) a voice recorder, (j) a PC card, and so on.

Figure 20:
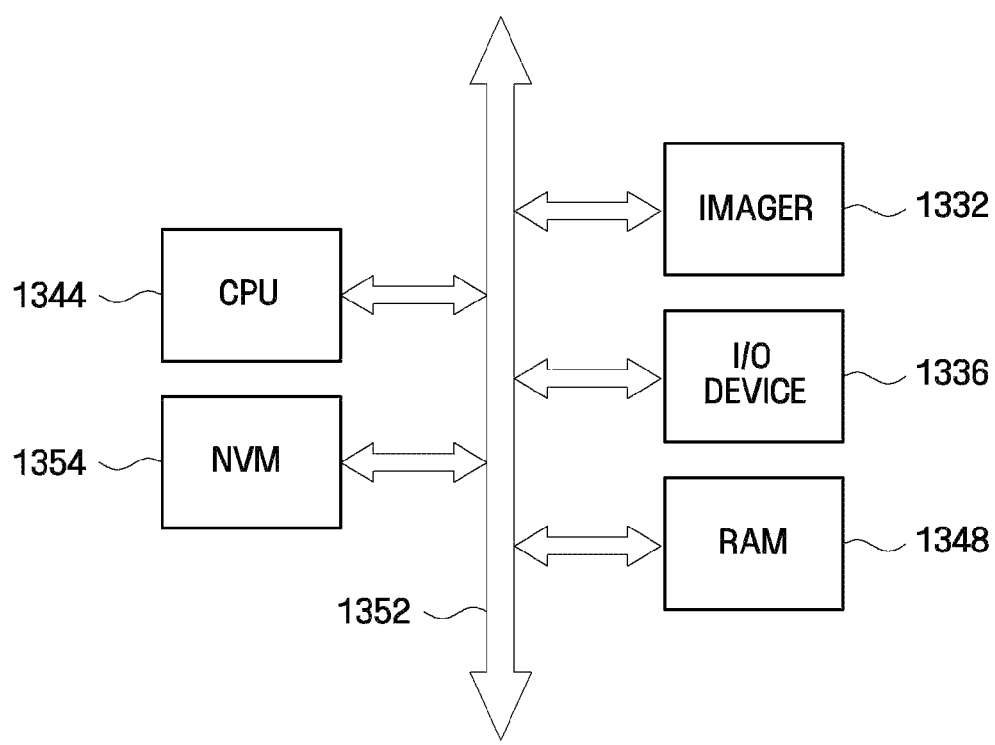

FIG. 20 is a block diagram of an exemplary image sensor system using a nonvolatile memory device, according to embodiments of the inventive concept.

Referring to FIG. 20, the image sensor system includes an image sensor or imager 1332, an input/output (I/O) device 1336, RAM 1348, a central processing unit (CPU) 1344, and a nonvolatile memory 1354 according to embodiments of the inventive concept. The respective components, that is, the image sensor 1332, the I/O device 1336, the RAM 1348, the CPU 1344, and the nonvolatile memory 1354, may communicate with each other through a bus 1352. The image sensor 1332 may include a photo sensing element, for example, such as a photo gate, a photo diode, and so on. The respective components may be incorporated into a single chip together with the processor, and the processor and the respective components may be configured as separate chips.

Figure 21:
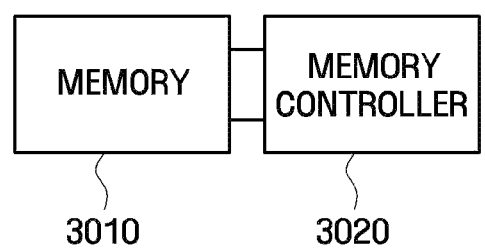
FIG. 21 is a block diagram of an exemplary memory system using a nonvolatile memory device, according to embodiments of the inventive concept.

FIG. 21 is an exemplary block diagram of a memory system using a nonvolatile memory device according to embodiments of the inventive concept.

As shown in FIG. 21, the memory 3010 is coupled to a memory controller 3020. The memory 3010 may be any one of the memories according to the above-described embodiments. The memory controller 3020 supplies input signals for controlling the operation of the memory 3010. For example, the memory controller 3020 may transmit a command CMD and an address signal to the memory 3010. The memory controller 3020 may include a memory interface, a host interface, an ECC circuit, a central processing unit (CPU), a buffer memory, and so on. The memory interface may transmit data from the buffer memory to the memory 3010 or may read data from the memory 3010 to then transmit the read data to the buffer memory. In addition, the memory interface may transmit the command CMD and the address signal from an external host to the memory 30120.

The host interface may communicate with an external host through one of various interface protocols such as universal serial bus (USB), small computer small interface (SCSI) protocol, peripheral component interconnection (PCI)-express protocol, advanced technology electronics (ATA) protocol, parallel-ATA protocol, serial-ATA (SATA) protocol, serial attached SCSI (SAS), and so on.

The memory system according to embodiments of the inventive concept may include an ECC circuit. The ECC circuit may generate parity bits using data transmitted to the memory 3010. The generated parity bits and data may be stored in a particular area of the memory 3010. The ECC circuit detects an error of data read from the memory 3010. If the detected error is a correctable error, the ECC circuit corrects the data.

The CPU controls the external host or the memory 3010 through the host interface or the memory interface. The CPU may control write, read or erase operations according to firmware for driving the memory 3010.

The buffer memory temporarily stores write data supplied from an external source or data read from the memory 3010. In addition, the buffer memory may store meta data or cache data to be stored in the memory 3010. During an abrupt power-off operation, the meta data or cache data stored in the buffer memory may be stored in the memory 3010. The buffer memory may be DRAM or SRAM.

Figure 22:
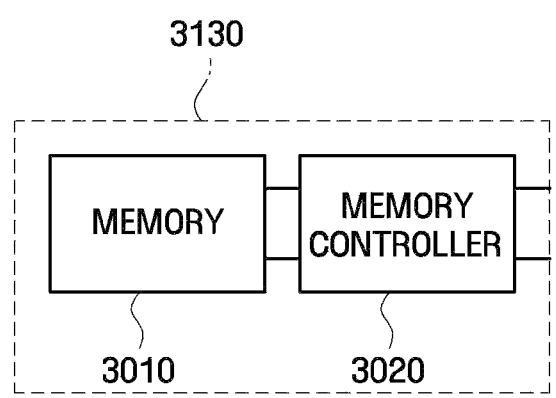
FIG. 22 is a block diagram of another exemplary memory system using a nonvolatile memory device, according to embodiments of the inventive concept.

FIG. 22 is a block diagram of another exemplary memory system using a nonvolatile memory device, according to embodiments of the inventive concept. The memory system according to the illustrated embodiment is substantially the same as the memory system shown in FIG. 20, except that the memory 3010 and the memory controller 3020 are embedded in a card 3130. For example, the card 3130 may be a flash memory card. That is, the card 3130 may be a standard product used in a consumer electronic device, such as a digital camera, a personal computer, and so on. The memory controller 3020 may control the memory 3010 according to a control signal supplied from another device (e.g., an external device).

Figure 23:
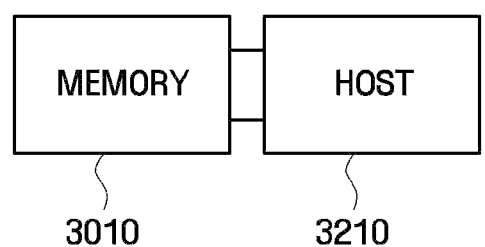
FIG. 23 is a block diagram of still another exemplary memory system using a nonvolatile memory device, according to embodiments of the inventive concept.

FIG. 23 is a block diagram of still another exemplary memory system using a nonvolatile memory device, according to embodiments of the inventive concept. As shown in FIG. 23, the memory 3010 may be coupled to a host 3210. The host 3210 may be a processing system, such as a personal computer, a digital camera, and so on. The host 3210 may use the memory 3010 as an erasable storage device, for example. As described above, the host 3210 may supply input signals for controlling the memory 3010. For example, the host 3210 may supply a command CMD and an address signal.

Figure 24:
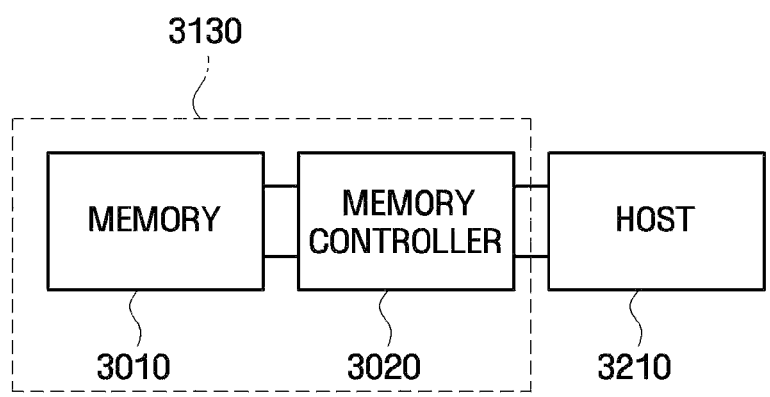
FIG. 24 is a block diagram of still another exemplary memory system using a nonvolatile memory device, according to embodiments of the inventive concept.

FIG. 24 is a block diagram of still another exemplary memory system using a nonvolatile memory device, according to embodiments of the inventive concept. A host 3210 and a card 3130 are coupled to each other. The host 3210 supplies a control signal to the card 3130 to allow the memory controller 3020 to control the memory 3010.

Figure 25:
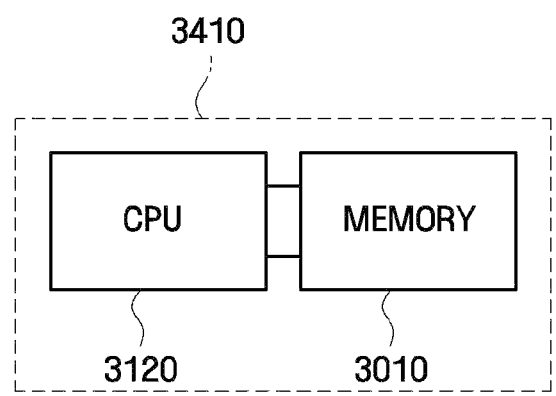
FIG. 25 is a block diagram of still another exemplary memory system using a nonvolatile memory device, according to embodiments of the inventive concept.

FIG. 25 is a block diagram of still another exemplary memory system using a nonvolatile memory device, according to embodiments of the inventive concept. The memory 3010 is connected to a CPU 3120 provided in a computer system 3410. For example, the computer system 3410 may be a personal computer, PDA, etc. The memory 3010 may be directly connected to the CPU 3120 through a bus.

The nonvolatile memory device according to embodiments of the inventive concept may be used as storage class memory (SCM). SCM is a general memory having a nonvolatile characteristic and an accessing characteristic. The SCM may be used as a data storage area and a program operating area.

The above-described nonvolatile memory device using a resistance material, such as PRAM, RRAM or MRAM, may be used as the SCM. The SCM may be used as a data storage memory, in place of a flash, or as a main memory, in place of SRAM. An SCM may replace a flash memory and SRAM.

Figure 26:
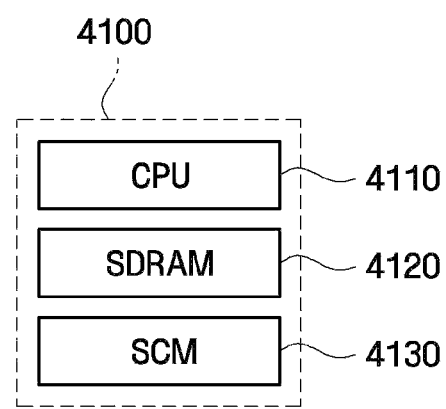
FIG. 26 is an exemplary block diagram illustrating a memory system using a storage class memory (SCM), according to embodiments of the inventive concept.

FIG. 26 is block diagram illustrating an exemplary memory system using SCM, according to embodiments of the inventive concept. The memory system 4100 includes a CPU 4110, SDRAM 4120 and SCM 4130 used in place of flash memory.

In the memory system 4100, a data access speed of the SCM 4130 is higher than that of the flash memory. For example, when the CPU 4110 operates at 4 GHz in a PC environment, data accessing of PRAM, a kind of the SCM 4130, is approximately 32 times faster than that of flash memory. Therefore, the memory system 4100 may achieve a higher-speed access gain than a memory system incorporating the flash memory.

Figure 27:
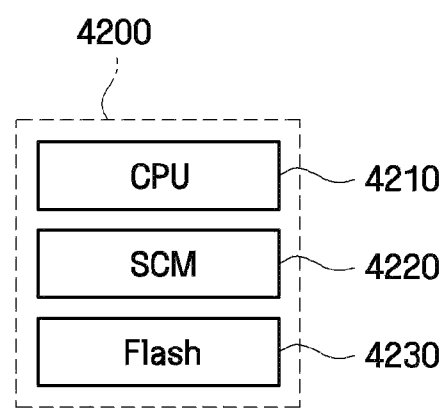
FIG. 27 is a block diagram illustrating another exemplary memory system using a storage class memory (SCM), according to embodiments of the inventive concept.

FIG. 27 is block diagram illustrating another exemplary memory system using SCM, according to embodiments of the inventive concept. The memory system 4200 includes a CPU 4210, SCM 4220 (used in place of SDRAM 3120 in FIG. 26), and flash memory 4230.

In the memory system 4200, the SCM 4220 uses a smaller amount of power than the SDRAM. The energy used by main memory of the computer system is approximately 40 percent of the energy used by the overall system. Thus, attempts are made to reduce the energy used by the main memory. The use of the SCM may reduce dynamic energy consumption by approximately 53 percent and power dissipation by approximately 73 percent. As a result, the memory system 4200 may considerably reduce energy consumption, compared to the memory system using SDRAM, for example.

Figure 28:
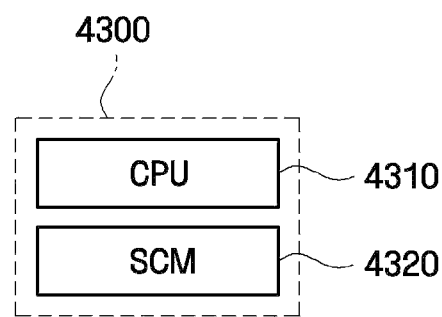
FIG. 28 is a block diagram illustrating another exemplary memory system using a storage class memory (SCM), according to embodiments of the inventive concept.

FIG. 28 is a block diagram illustrating another exemplary memory system using SCM, according to embodiments of the inventive concept. The memory system 4300 includes a CPU 4310 and SCM 4320 (used in place of an SDRAM 4120 in FIG. 26), but no flash memory. The SCM 4320 may be used as a main memory, instead of the SDRAM, and may be used as a data storage memory, instead of the flash memory 4230 in FIG. 27. The memory system 4300 is advantageous in view of data access speed, low power consumption, space utilization, and cost efficiency.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of driving a nonvolatile memory device, comprising:
   selecting first write drivers based on a predetermined current;

performing a first program operation on resistive memory cells corresponding to the first write drivers;

verifying whether the resistive memory cells have passed or failed in the first program operation and sorting information regarding failed bit memory cells that failed in the first program operation;

selecting second write drivers based on the sorted failed bit memory cell information; and performing a second program operation on resistive memory cells corresponding to the second write drivers.

2. The method of claim 1, wherein data of the same logic state is programmed during the first program operation and the second program operation.

3. The method of claim 1, wherein the predetermined current is the maximum operation current determined at a time of manufacturing the resistive memory cells.

4. The method of claim 1, wherein, when an increment step pulse program (ISPP) is used during the second program operation, the number of the second write drivers is less than the number of the first write drivers.

5. The method of claim 4, wherein, when a decrement step pulse program (DSPP) is used during the second program operation, the number of the second write drivers is greater than the number of the first write drivers.

6. The method of claim 1, wherein, when a higher program current is used during the second program operation than during the first program operation, the number of the second write drivers is less than the number of the number of the first write drivers.

7. The method of claim 1, wherein, when a lower program current is used during the second program operation than during the first program operation, the number of the second write drivers is less than the number of the first write drivers.

8. The method of claim 1, wherein the sorted failed bit memory cell information is stored in a register of a write buffer.

9. The method of claim 1, wherein the sorted failed bit memory cell information comprises addresses of the failed bit memory cells, which include column addresses and row addresses.

10. The method of claim 1, wherein, when the first write drivers are selected, a current value applied during the first program operation is referred to.

11. The method of claim 1, wherein, when the second write drivers are selected, a current value applied during the second program operation is referred to.

12. The method of claim 1, wherein the number of the selected first write drivers is obtained by dividing the predetermined current by a current value applied during the first program operation.

13. The method of claim 1, wherein the number of the selected second write drivers is obtained by dividing the predetermined current by a current value applied during the second program operation.

14. A method of driving a nonvolatile memory device, the method comprising:

selecting resistive memory cells corresponding to a first logic state among multi level states;

selecting first write drivers operable with a predetermined current among the selected resistive memory cells;

allowing the selected first write drivers to perform a program operation on the resistive memory cells with the first logic state, verifying the programmed resistive memory cells and sorting addresses of failed bit resistive memory cells; and selecting second write drivers operable with the predetermined current among the failed bit resistive memory cells and reprogramming the selected second write drivers with the first logic state.

15. The method of claim 14, wherein the selected first write drivers and the selected second write drivers overlap.

16. The method of claim 14, wherein, when an increment step pulse program (ISPP) is used during the second program operation, the number of the second write drivers is less than the number of the first write drivers.

17. The method of claim 14, wherein, when a decrement step pulse program (DSPP) is used during the second program operation, the number of the second write drivers is greater than the number of the first write drivers.

18. The method of claim 14, wherein the selecting of the second write drivers further comprises verifying memory cells corresponding to the first logic state and selecting the second write drivers among the verified memory cells.

19. The method of claim 14, wherein, when all of the resistive memory cells corresponding to the first logic state pass the verifying, the resistive memory cells corresponding to a second logic state are selected, second write drivers corresponding to the selected resistive memory cells and operable with the predetermined current are selected, and the resistive memory cells corresponding to the first write drivers are programmed with the second logic state and verified, thereby sorting addresses of failed memory cells.

* * * * *